(12) United States Patent
Jhothiraman et al.

(10) Patent No.: US 12,707,950 B2
(45) Date of Patent: Aug. 11, 2026

(54) MEMORY CIRCUITRY AND METHOD USED IN FORMING MEMORY CIRCUITRY

(71) Applicant: Micron Technology, Inc., Boise, ID (US)

(72) Inventors: Jivaan Kishore Jhothiraman, Meridian, ID (US); Chandra Tiwari, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 935 days.

(21) Appl. No.: 17/944,343

(22) Filed: Sep. 14, 2022

(65) Prior Publication Data

US 2024/0071932 A1 Feb. 29, 2024

Related U.S. Application Data

(60) Provisional application No. 63/402,585, filed on Aug. 31, 2022.

(51) Int. Cl.
*H10W 20/20* (2026.01)
*H10B 41/27* (2023.01)
(Continued)

(52) U.S. Cl.
CPC ............ *H10W 20/20* (2026.01); *H10B 41/27* (2023.02); *H10B 43/27* (2023.02); *H10W 20/435* (2026.01); *H10W 20/48* (2026.01)

(58) Field of Classification Search
CPC ... H10W 20/20; H10W 20/435; H10W 20/48; H10B 41/27; H10B 43/27; H10B 43/50;
(Continued)

(56) References Cited

U.S. PATENT DOCUMENTS 8,178,917 B2 * 5/2012 Tanaka .................. H10B 43/27 438/257
8,569,829 B2 10/2013 Kiyotoshi
(Continued)

FOREIGN PATENT DOCUMENTS

JP 2017-054989 3/2017
KR 10-2019-0006142 1/2019

OTHER PUBLICATIONS

U.S. Appl. No. 17/851,393, filed Jun. 28, 2022, by Jhothiraman.

*Primary Examiner* — Andres Munoz
(74) *Attorney, Agent, or Firm* — Wells St. John P.S.

(57) ABSTRACT

A method used in forming memory circuitry comprises forming a stack comprising vertically-alternating first tiers and second tiers. The stack extends from a memory-array region into a stair-step region. The stack in the stair-step region comprises a cavity comprising a flight of stairs in a vertical cross-section along a first direction. The first tiers are conductive and the second tiers are insulative in a finished-circuitry construction. An insulating lining is formed in the cavity atop treads of the stairs and laterally-over sidewalls of the cavity that are along the first direction. Individual of the treads comprise conducting material of one of the conductive tiers in the finished-circuitry construction. The insulating lining is thicker in a bottom part of the cavity than over the sidewalls of the cavity that are above the bottom part. Insulative material is formed in the cavity directly above the insulating lining. Conductive vias are formed through the insulative material and the insulating lining. Individual of the conductive vias are directly above and directly against the conducting material of the tread of individual of the stairs. Other embodiments, including structure, are disclosed.

8 Claims, 50 Drawing Sheets

(51) Int. Cl.

| | |
|---|---|
| ***H10B 43/27*** | (2023.01) |
| ***H10W 20/41*** | (2026.01) |
| ***H10W 20/48*** | (2026.01) |

(58) Field of Classification Search

CPC ........ H10B 41/10; H10B 41/50; H10B 43/10; H01L 23/535; H01L 23/5283; H01L 23/5329; H01L 27/11556; H01L 27/11582

See application file for complete search history.

(56) References Cited

U.S. PATENT DOCUMENTS

| | | | | |
|---|---|---|---|---|
| 8,970,046 | B2 | 3/2015 | Kim et al. | |
| 9,184,177 | B2 | 11/2015 | Imamura et al. | |
| 9,356,038 | B2 | 5/2016 | Lee et al. | |
| 9,418,922 | B2 | 8/2016 | Park et al. | |
| 9,478,546 | B2 | 10/2016 | Yang | |
| 9,536,982 | B1 | 1/2017 | Cheng et al. | |
| 9,543,319 | B1 | 1/2017 | Wu et al. | |
| 9,633,944 | B2 | 4/2017 | Kim | |
| 9,953,999 | B2 | 4/2018 | Nam et al. | |
| 10,134,672 | B2 | 11/2018 | Inatsuka | |
| 10,269,625 | B1 | 4/2019 | Matovu | |
| 10,304,852 | B1 | 5/2019 | Cui | |
| 10,727,115 | B2 | 7/2020 | Nam et al. | |
| 11,177,271 | B2 * | 11/2021 | Tessariol | H10B 43/27 |
| 11,430,873 | B2 | 8/2022 | Hafez et al. | |
| 11,798,916 | B2 | 10/2023 | Tsai et al. | |
| 11,830,815 | B2 * | 11/2023 | Jain | H10B 41/50 |
| 2011/0115010 | A1 | 5/2011 | Shim et al. | |
| 2011/0289924 | A1 | 12/2011 | Pietsch | |
| 2012/0077320 | A1 | 3/2012 | Shim et al. | |
| 2013/0161821 | A1 * | 6/2013 | Hwang | H10B 41/20 257/E21.585 |
| 2013/0334591 | A1 | 12/2013 | Matsuda | |
| 2015/0060988 | A1 | 3/2015 | Lee et al. | |
| 2016/0268269 | A1 | 9/2016 | Ichinose | |
| 2016/0284727 | A1 | 9/2016 | Sonehara et al. | |
| 2017/0077122 | A1 * | 3/2017 | Ono | H10B 43/27 |
| 2017/0154895 | A1 | 6/2017 | Huo | |
| 2018/0151588 | A1 | 5/2018 | Tsutsumi et al. | |
| 2018/0330985 | A1 * | 11/2018 | Yu | H10W 20/089 |
| 2019/0013237 | A1 | 1/2019 | Nam et al. | |
| 2019/0206727 | A1 * | 7/2019 | Matovu | H10P 95/062 |
| 2019/0229125 | A1 | 7/2019 | Zhou et al. | |
| 2019/0267322 | A1 * | 8/2019 | Freeman | H10B 41/50 |
| 2019/0371728 | A1 * | 12/2019 | Gossman | H10B 43/50 |
| 2020/0203220 | A1 | 6/2020 | Matovu et al. | |
| 2021/0134736 | A1 | 5/2021 | Jhothiraman et al. | |
| 2021/0151455 | A1 * | 5/2021 | Xu | H10B 41/50 |
| 2021/0335803 | A1 * | 10/2021 | Tiwari | H10B 41/10 |
| 2022/0013530 | A1 * | 1/2022 | Jhothiraman | H10B 41/10 |
| 2023/0009880 | A1 * | 1/2023 | Xu | H10B 43/10 |
| 2023/0063111 | A1 * | 3/2023 | Luo | H10B 43/50 |
| 2023/0307350 | A1 * | 9/2023 | Xu | H10B 43/50 |

* cited by examiner 10
81
7
66d
88
70
85
75
69
55
8
71
67
88
75
81
24
99

10
13
18
16
11
17
66d
71
99
6
7

10
12
BP
20
22
18
11
64
71
66s
13
99
24
26

10b
81
32
66d
88
70
85
75
69
76
33
55
71
67
24
99

10b
13
18
16
17
11
BP
64
66d
67
69
76
79
55
T3
T4

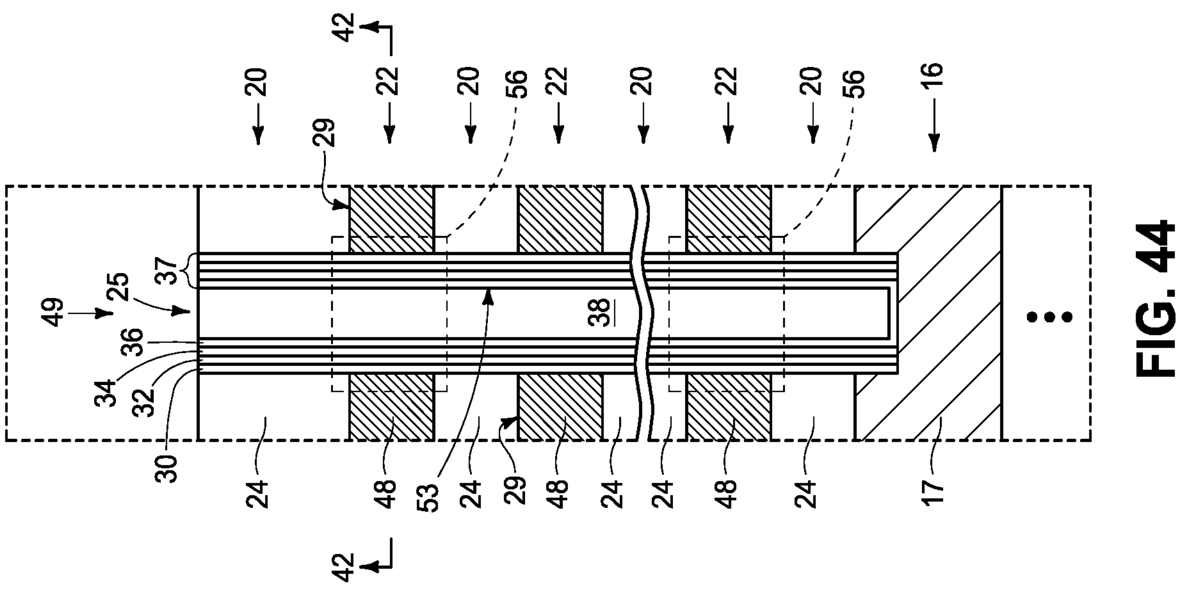
FIG. 44
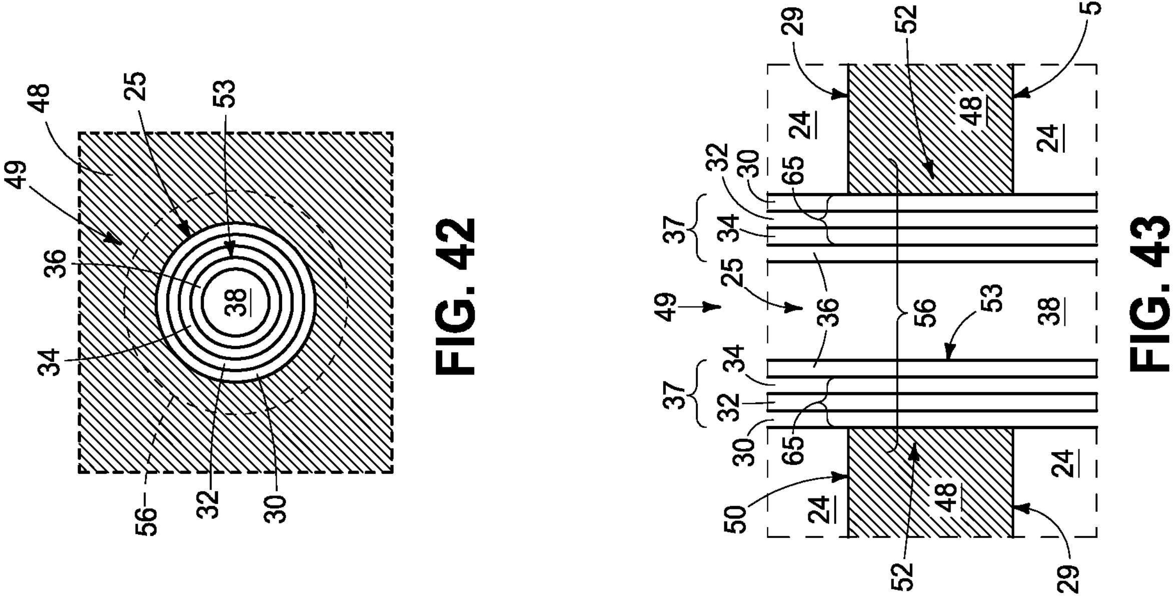
FIG. 42
FIG. 43

MEMORY CIRCUITRY AND METHOD USED IN FORMING MEMORY CIRCUITRY

RELATED PATENT DATA

This application claims priority to U.S. Provisional Patent Application Ser. No. 63/402,585, filed Aug. 31, 2022, entitled "Memory Circuitry And Method Used In Forming Memory Circuitry", naming Jivaan Kishore Jhothiraman and Chandra Tiwari as inventors, the disclosure of which is incorporated by reference.

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
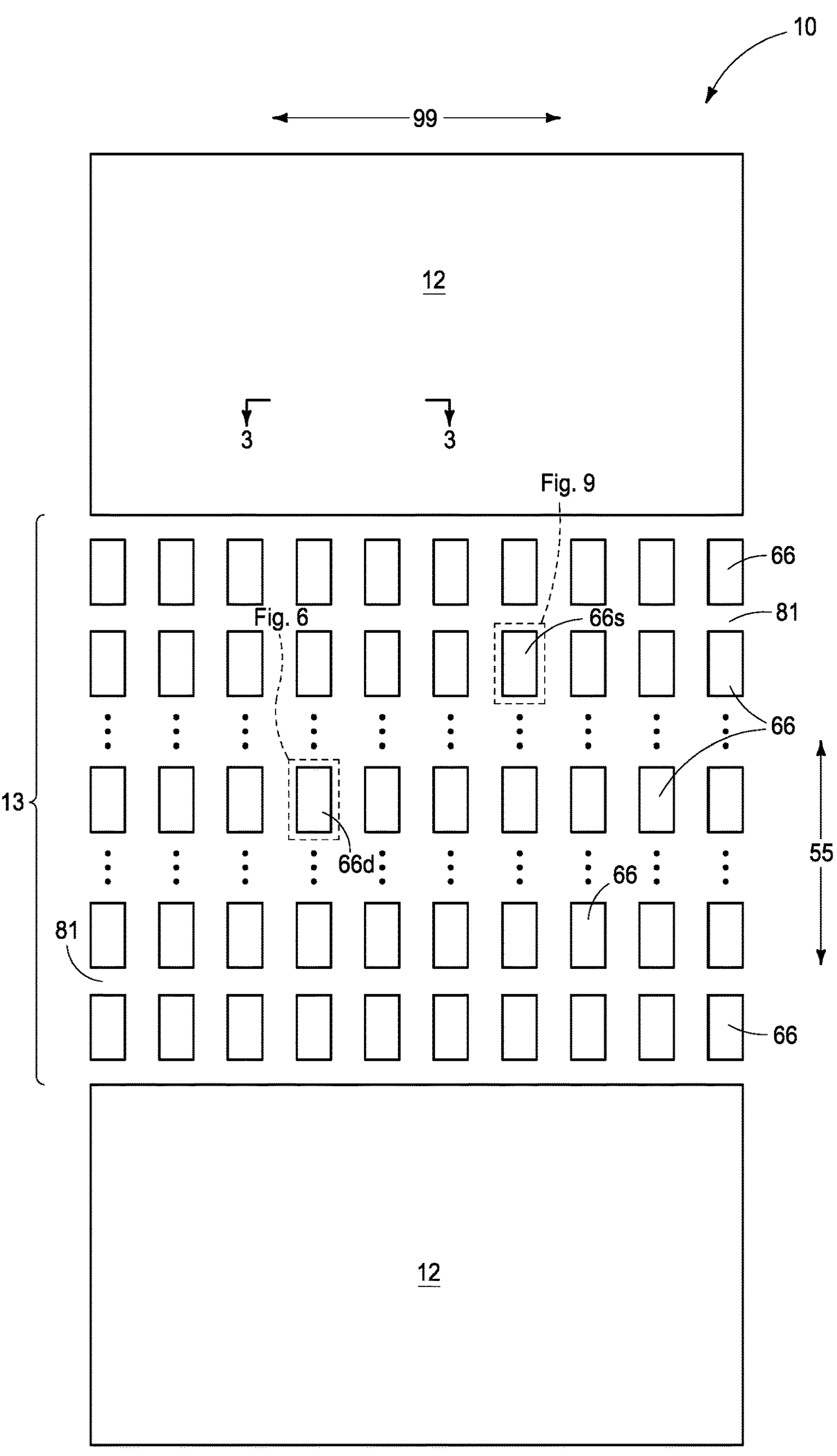
FIG. 1 is a diagrammatic view of a portion of memory circuitry in process in accordance with embodiments of the invention.
Figure 56:
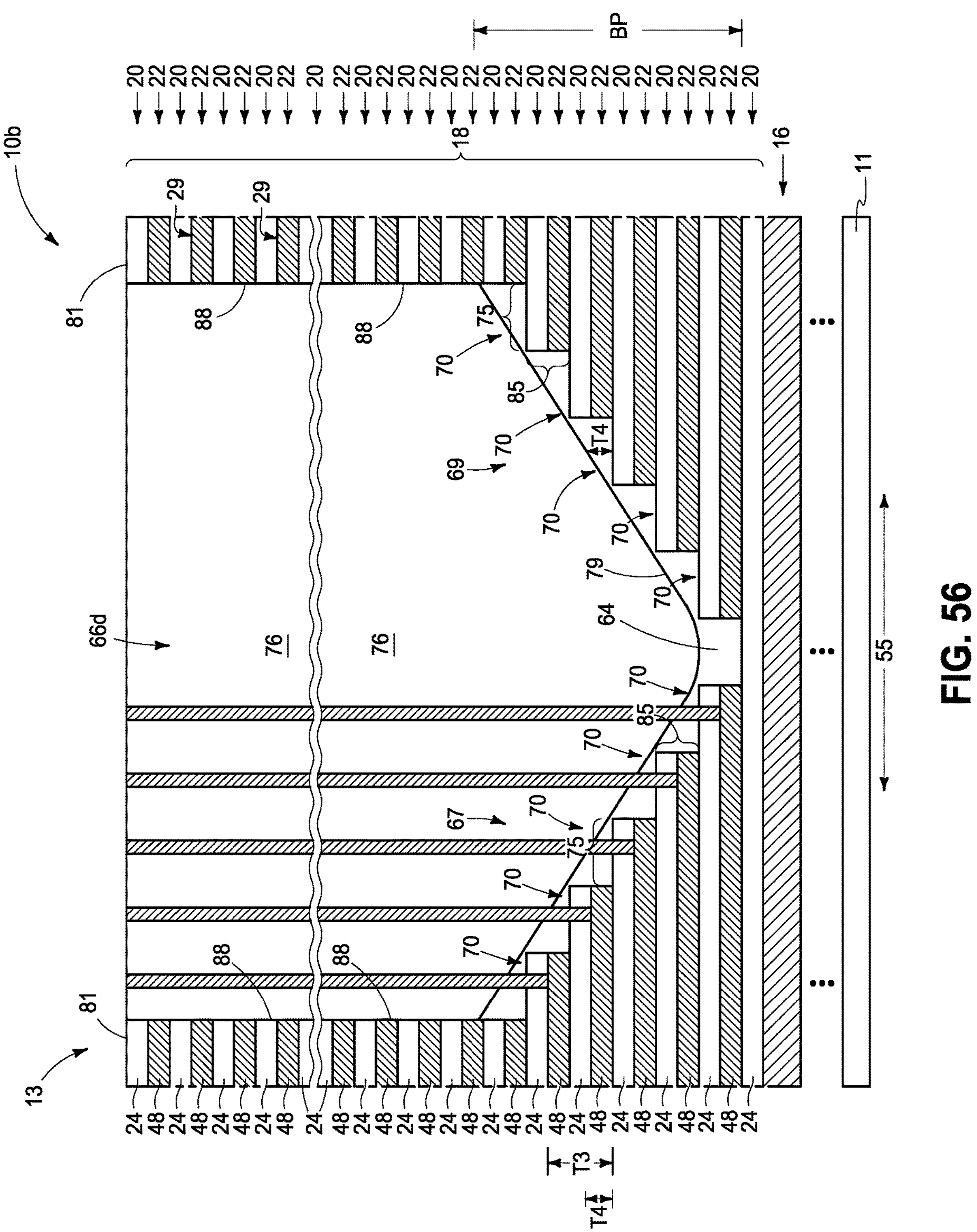

Embodiments of the invention encompass methods used in forming integrated circuitry, for example memory circuitry comprising a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry such as that comprising a memory array comprising strings of memory cells (e.g., NAND architecture) independent of method of manufacture. Some example embodiments are described with reference to FIGS. 1-56.

FIGS. 1-11 show an example construction 10 having two memory-array regions 12 in which elevationally-extending strings of transistors and/or memory cells will be formed. The two memory-array regions 12 may be of the same or different constructions relative one another. In one embodiment, a stair-step region 13 is between memory-array regions 12 and comprises stair-step structures as described below. Alternately, by way of example, a stair-step region may be at the end of a single memory-array region (not shown). FIGS. 6-11 are of different and varying scales compared to FIGS. 1-5 for clarity in disclosure more pertinent to stair-step region 13 than to memory-array regions 12. Example construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-11—depicted materials. For example, other partially or wholly fabricated components of integrated circuitry may be provided somewhere above, about, or within base substrate 11. Control and/or other peripheral circuitry for operating components within an array (e.g., individual array regions 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., $WSi_x$ under conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A vertical stack 18 comprising vertically-alternating insulative tiers 20 and conductive tiers 22 is directly above conductor tier 16 and extends from memory array region(s) 12 into stair-step region 13 along a first direction 55. In some embodiments, conductive tiers 22 may be referred to as first tiers 22 and insulative tiers 20 may be referred to as second tiers 20, with first tiers 22 being conductive and second tiers 20 being insulative at least in a finished-circuitry construction. Example thickness for each of tiers 20 and 22 is 20 to 60 nanometers. The example uppermost tier 20 may be thicker/thickest compared to one or more other tiers 20 and/or 22. Example first tiers 22 comprise material 26 (e.g., silicon nitride) and example second tiers 20 comprise material 24 (e.g., silicon dioxide). Only a small number of tiers 20 and 22 is shown in FIGS. 2-11 and other figures, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier.

Channel openings 25 have been formed (e.g., by etching) through insulative tiers 20 and conductive tiers 22 to conductor tier 16. Channel openings 25 may taper radially-inward and/or radially-outward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired and/or to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along first direction 55, with a second direction 99 being orthogonal thereto. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

The figures show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figures 2, 3, 4, 5:
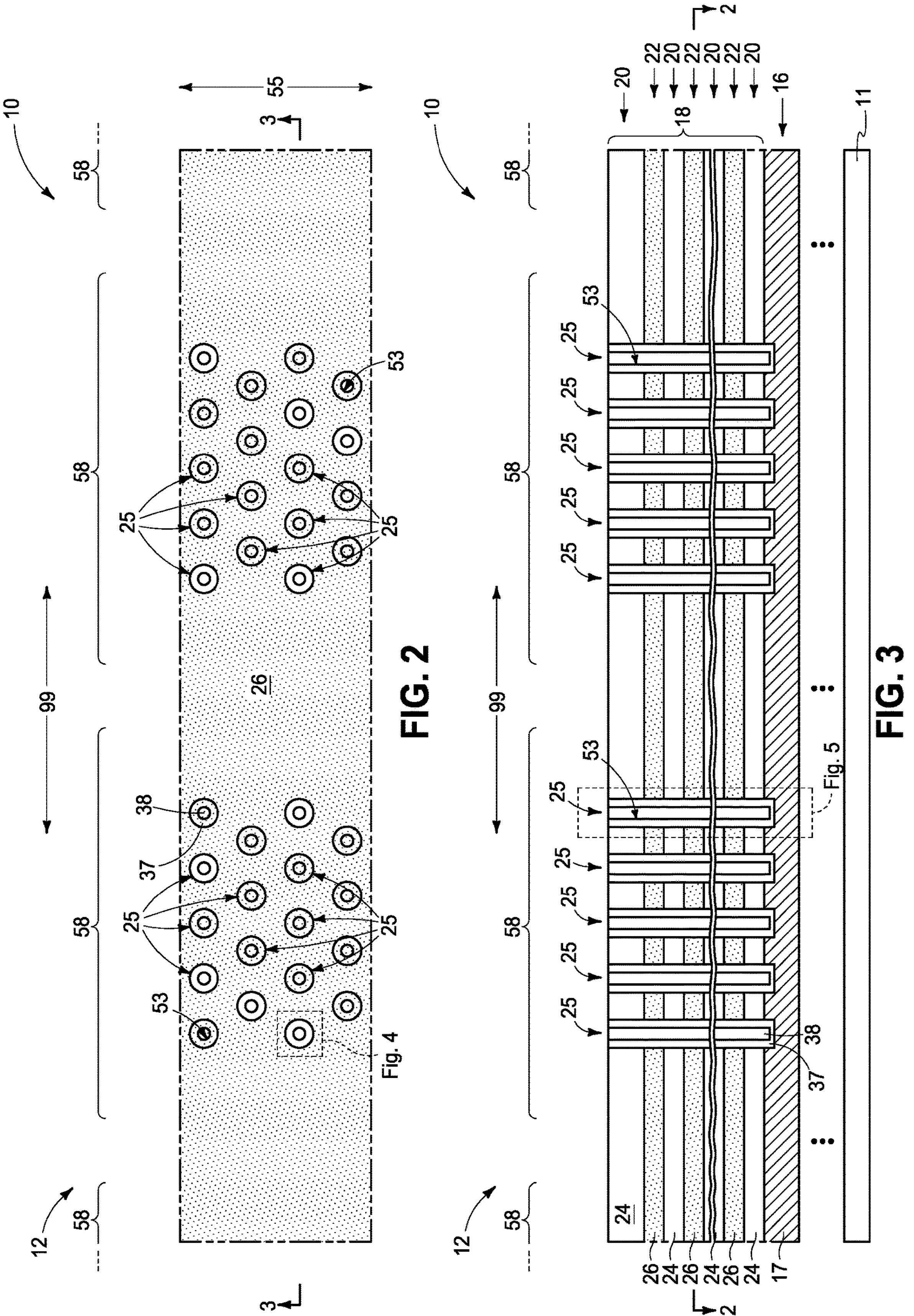
FIG. 3 is a diagrammatic cross-sectional view taken through line 3-3 in FIG. 1.
FIGS. 2 and 4-56 are diagrammatic sectional, expanded, enlarged, and/or partial views of the construction of FIGS. 1-3 or portions thereof, and/or of alternate embodiments.
Figures 4, 5:
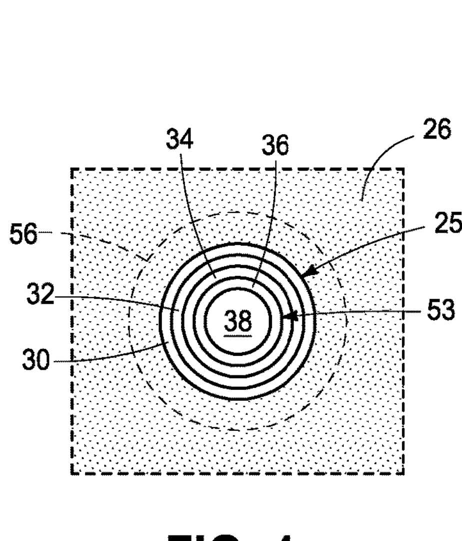
Figure 6:
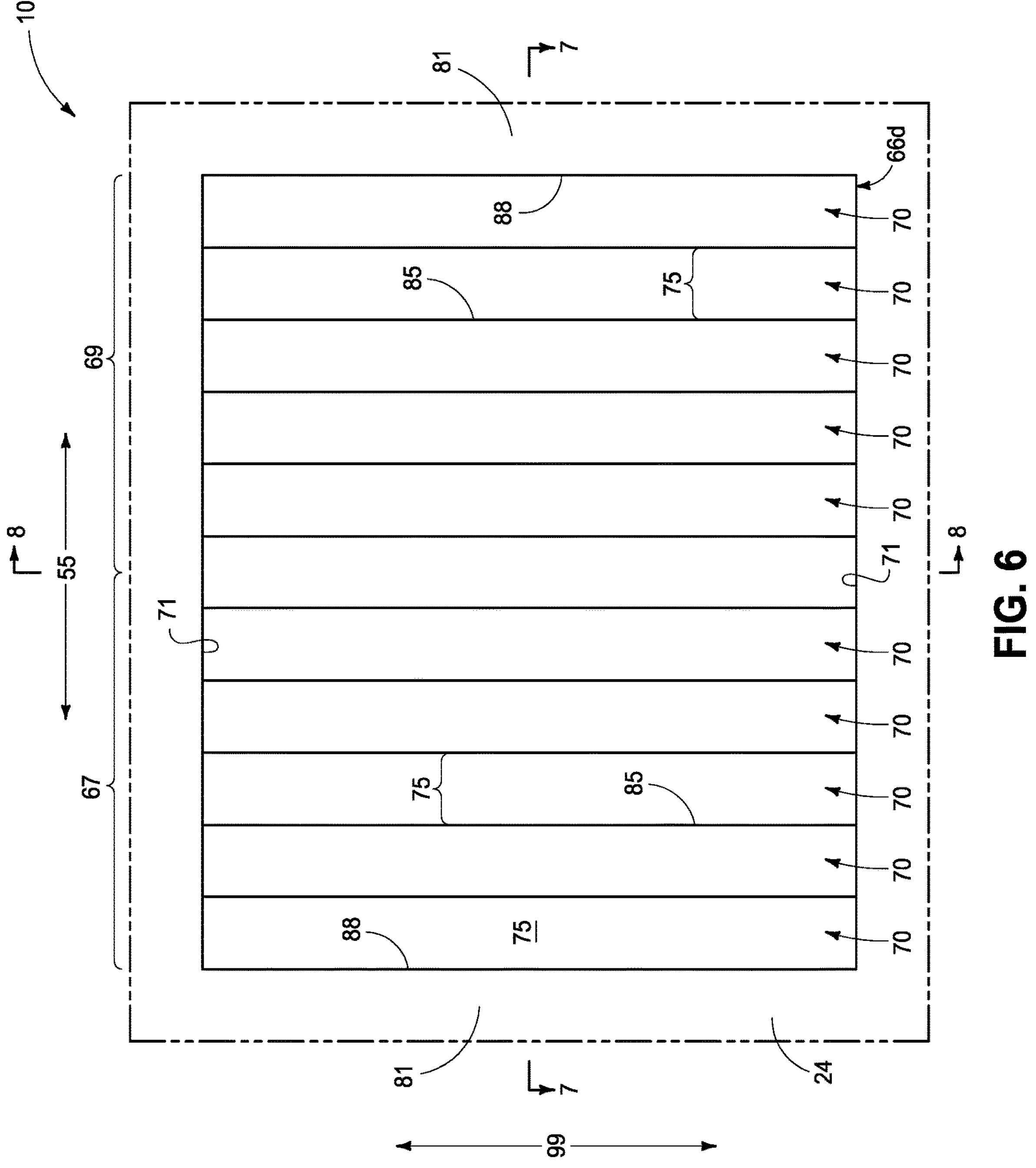
Figure 7:
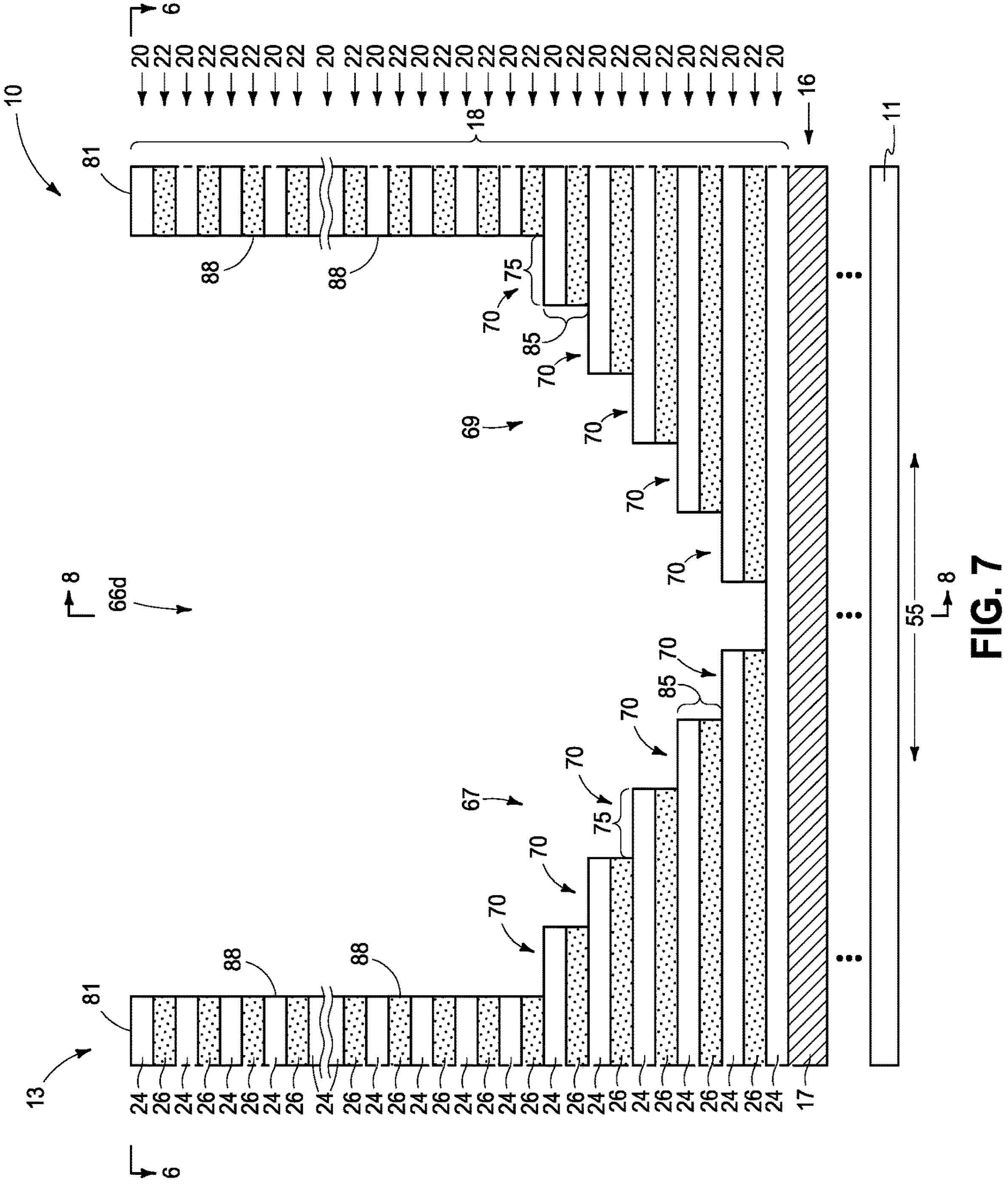
Figure 8:
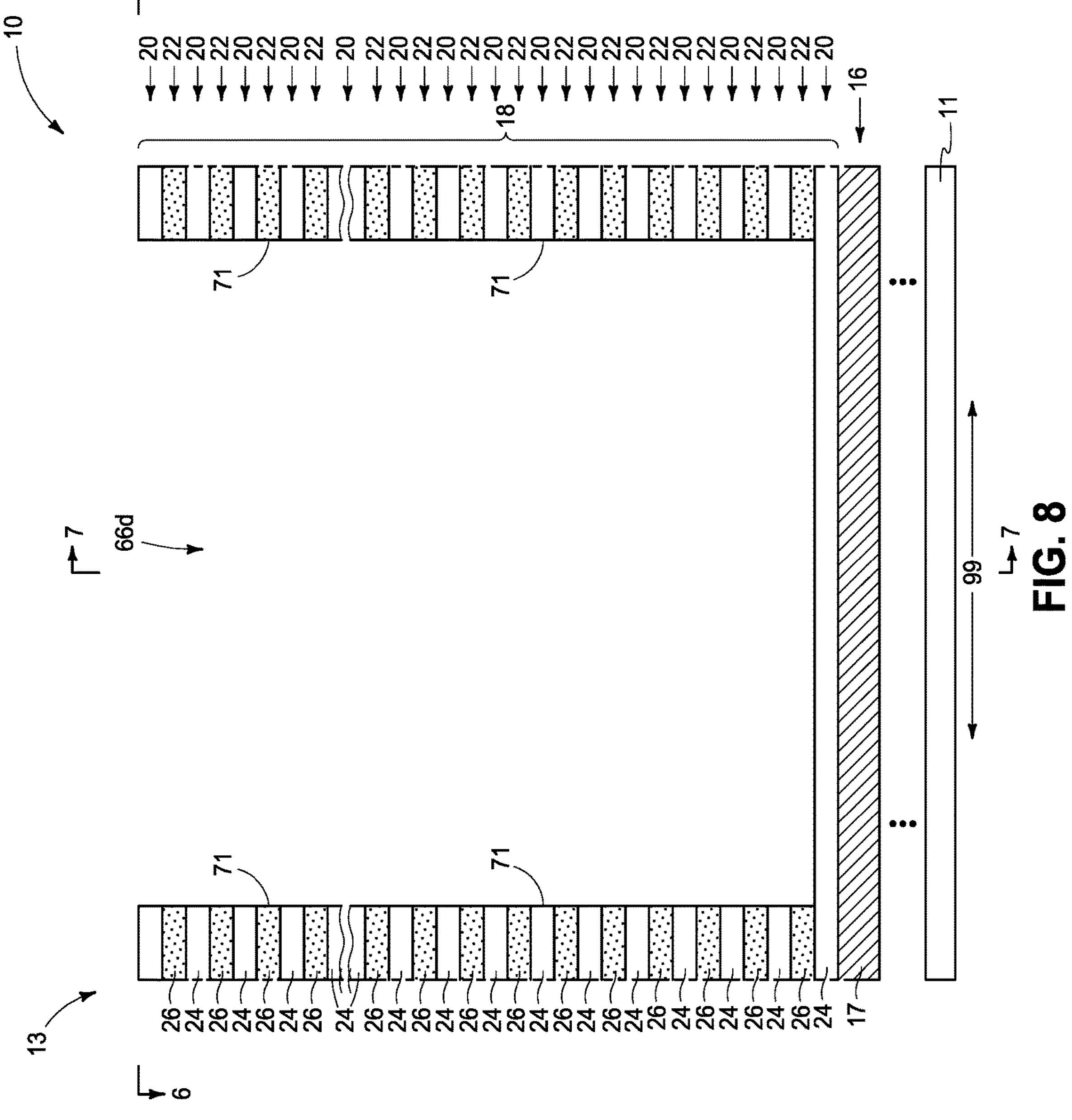
Figure 9:
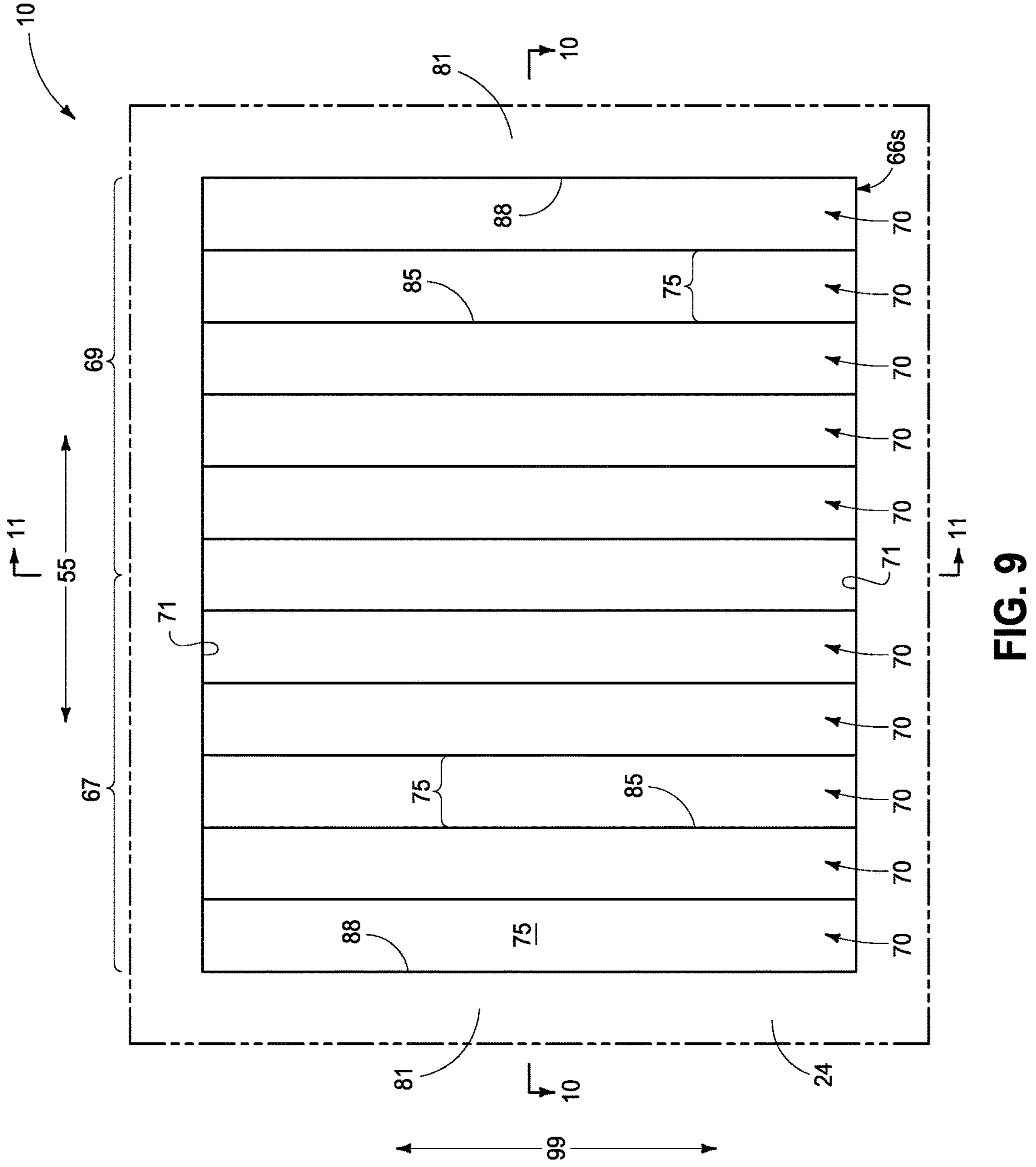
Figure 10:
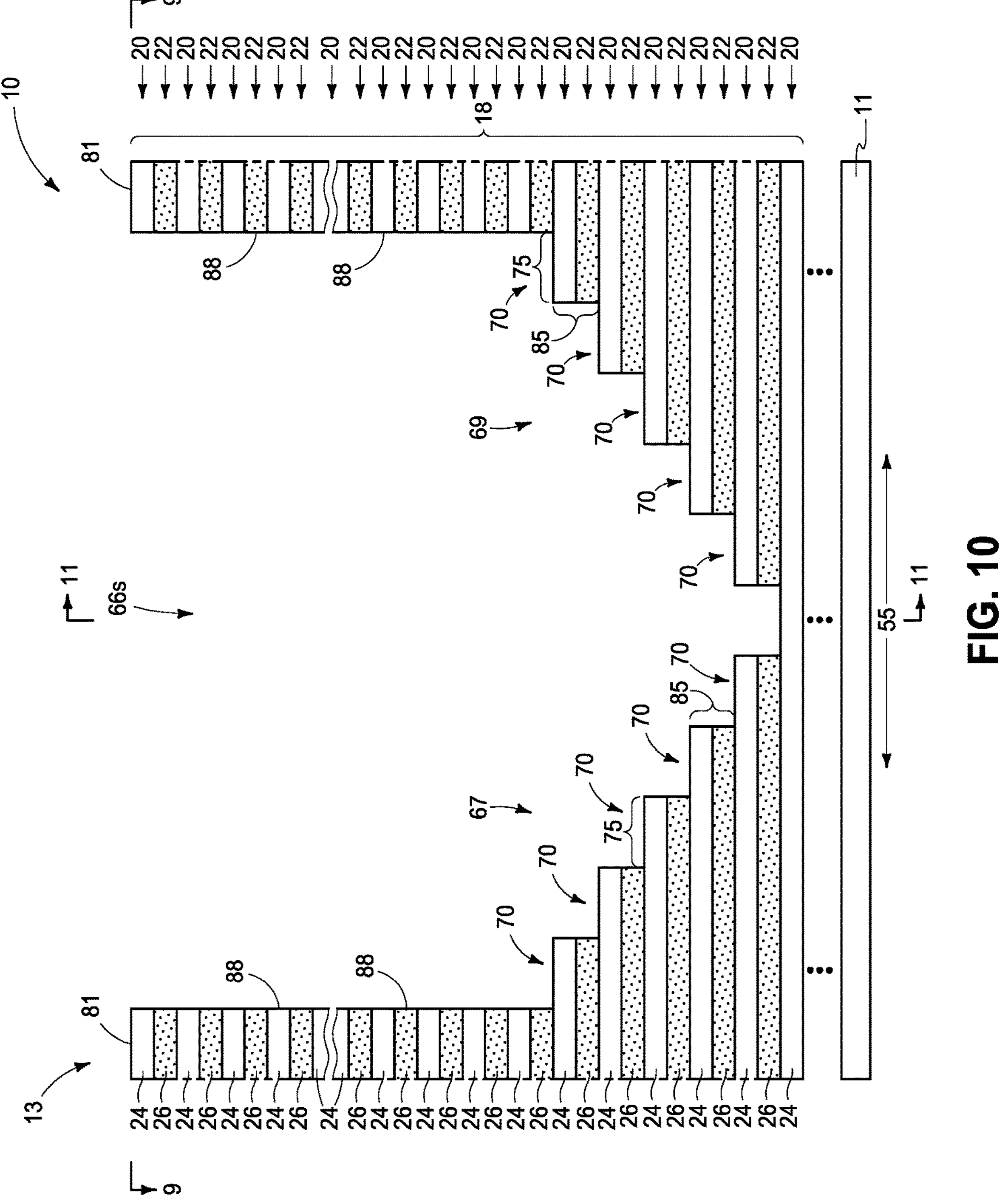
Figure 11:
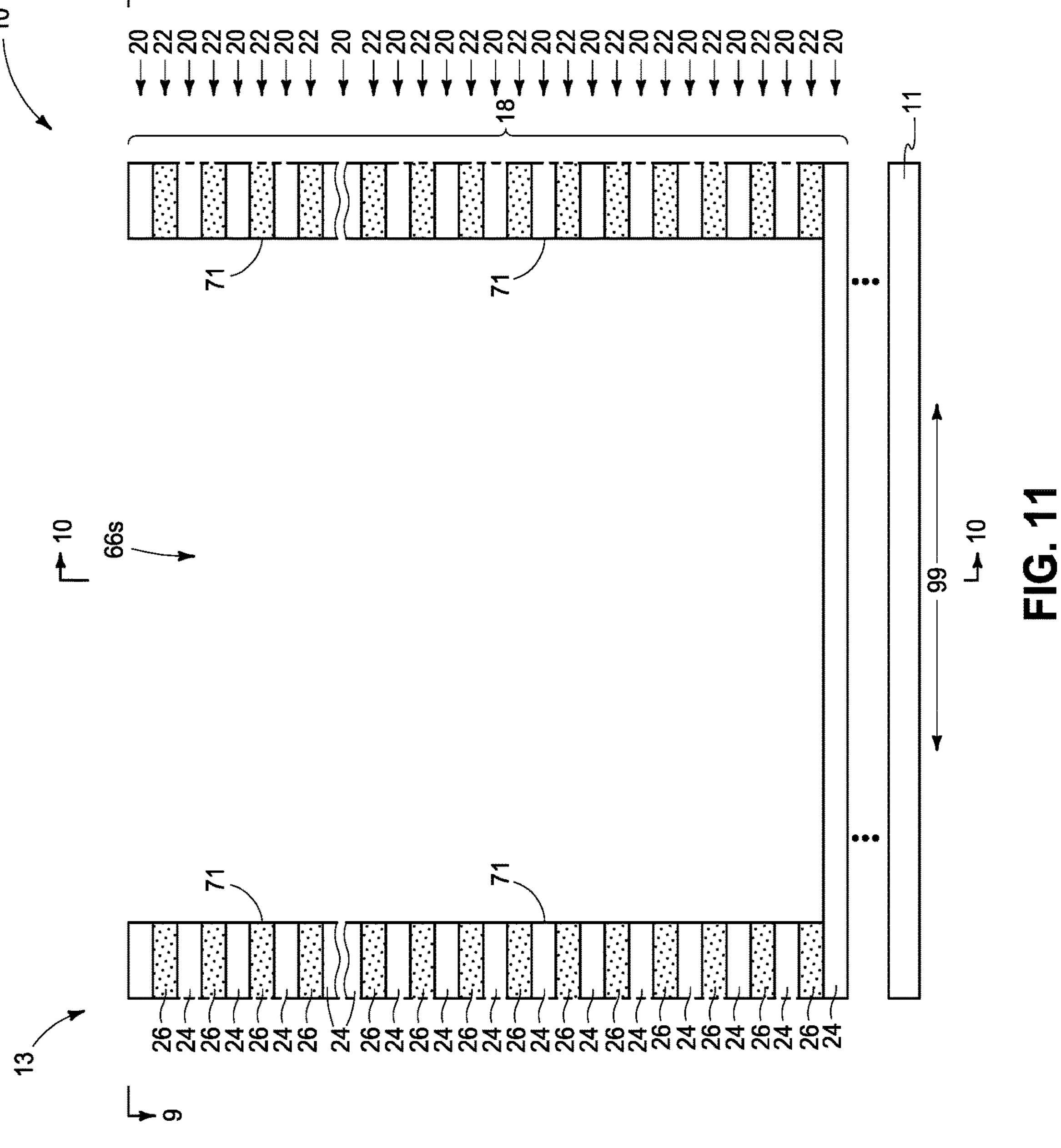
Figure 12:
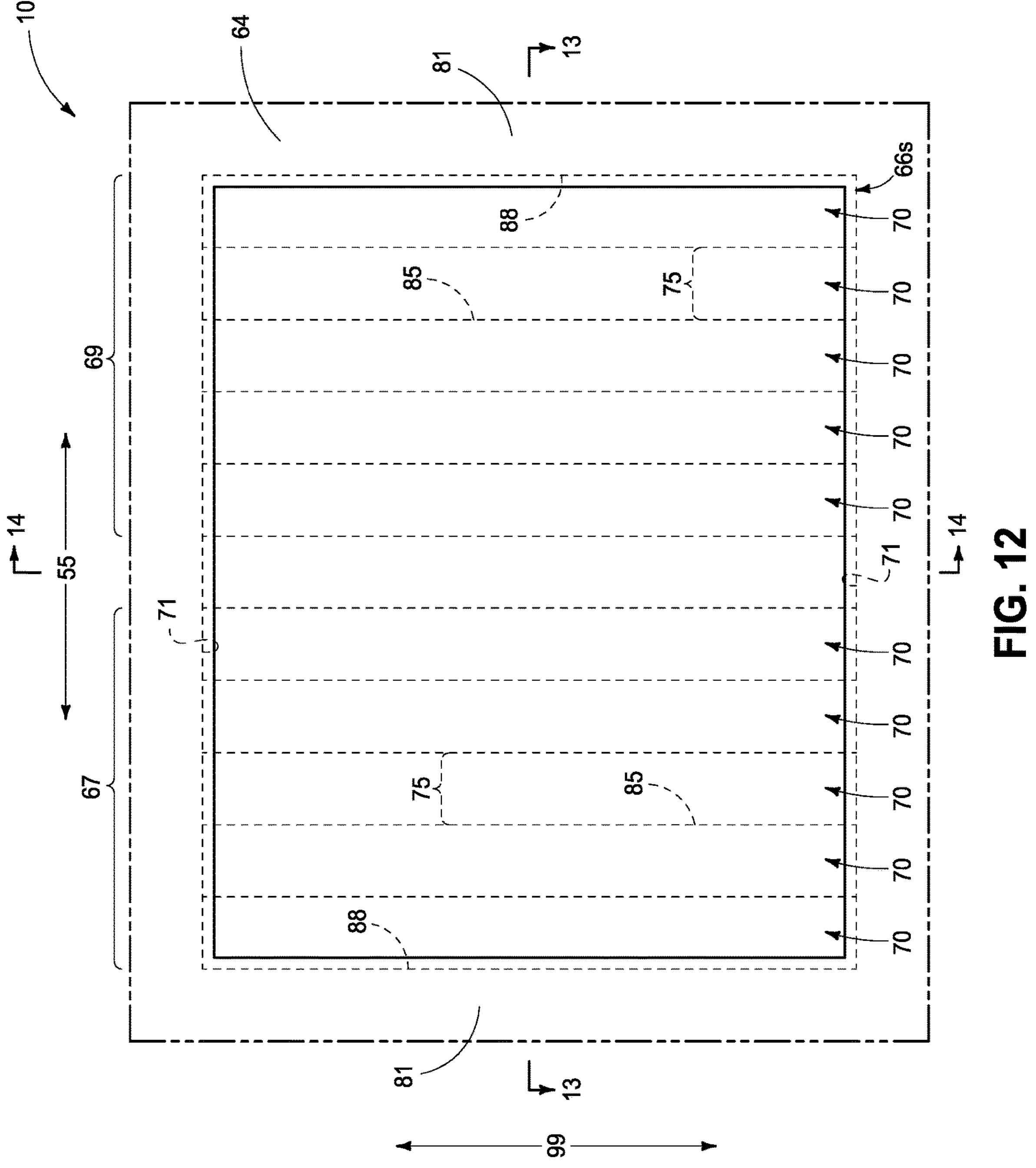
Figure 13:
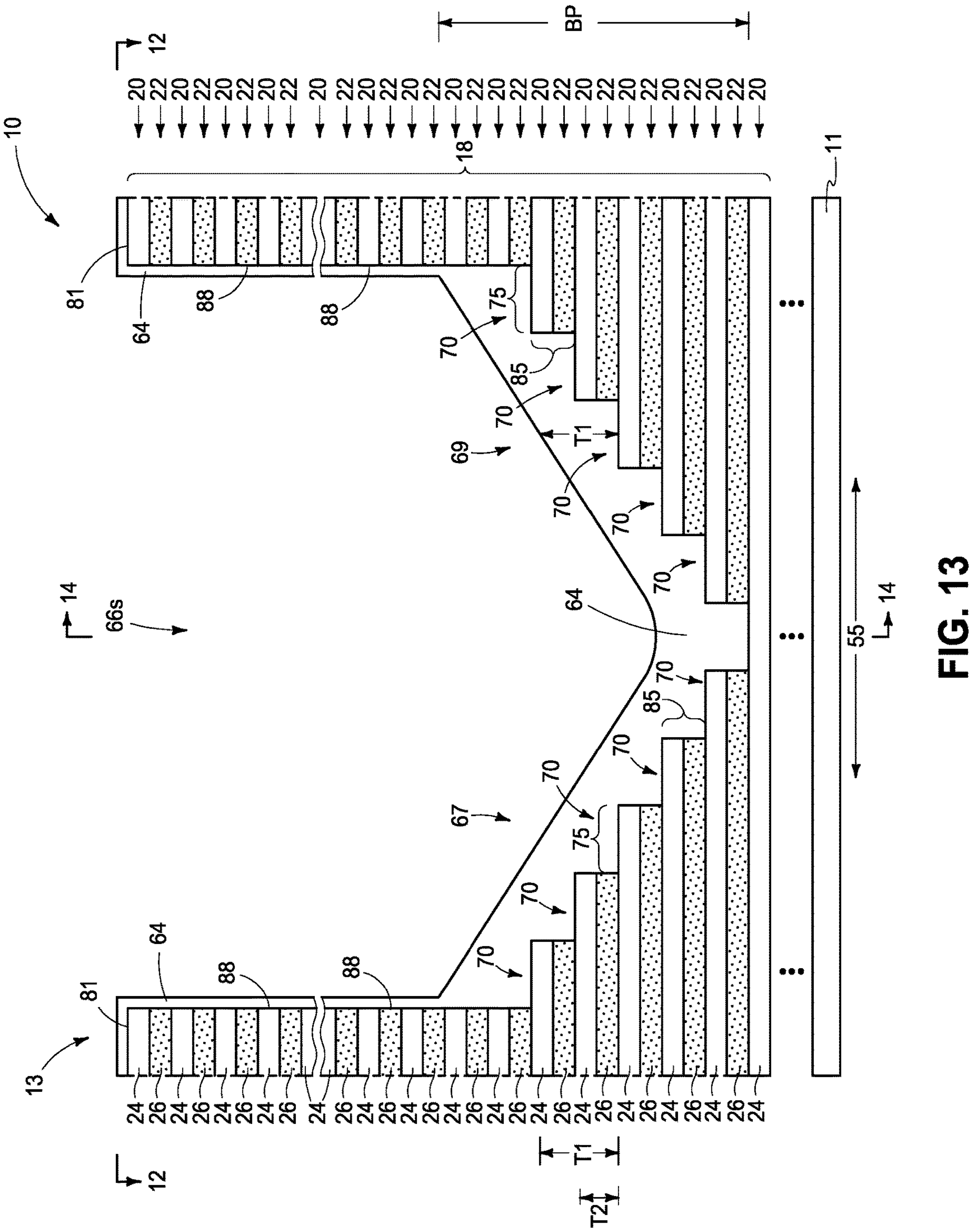
Figure 14:
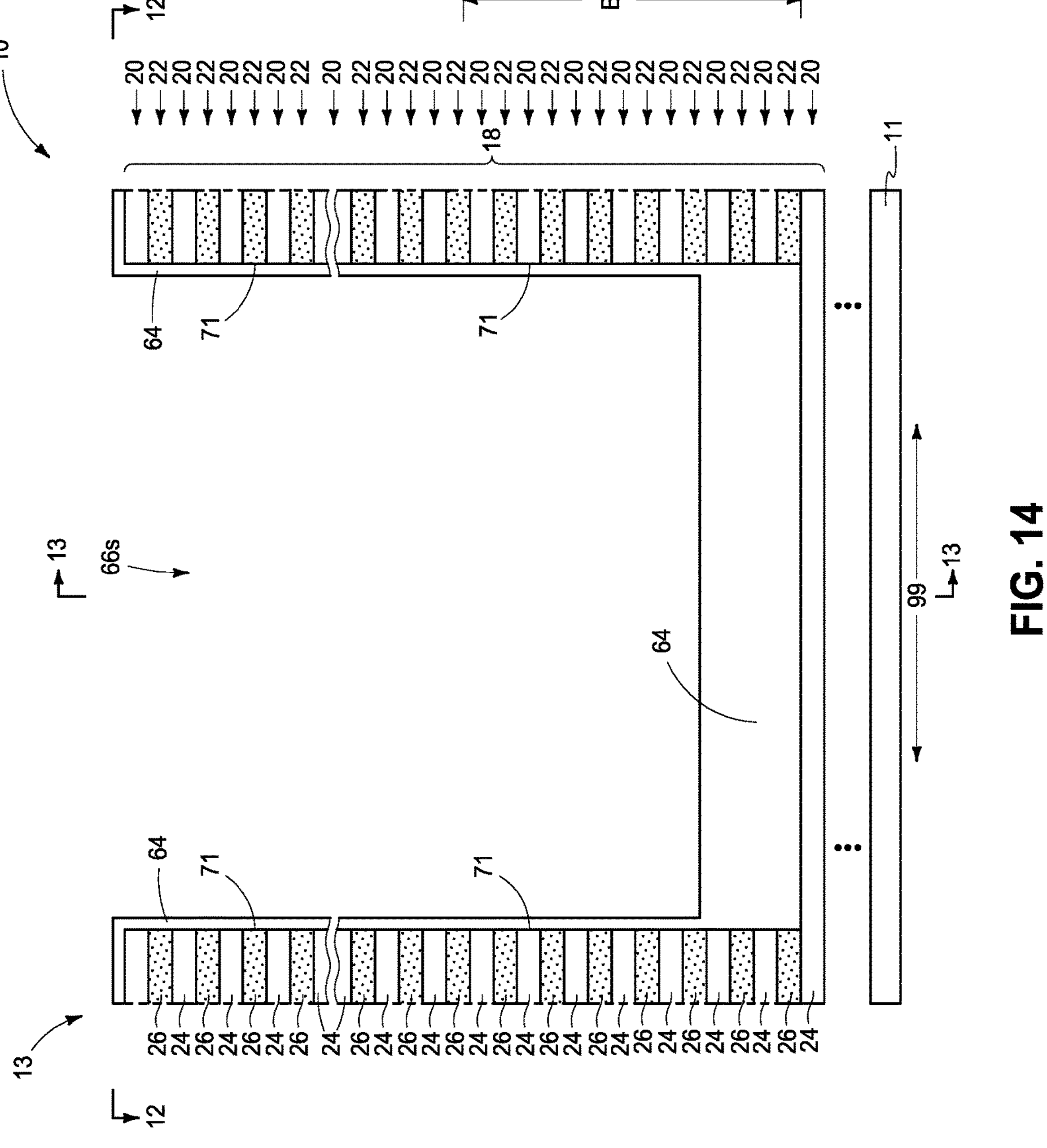
Figure 15:
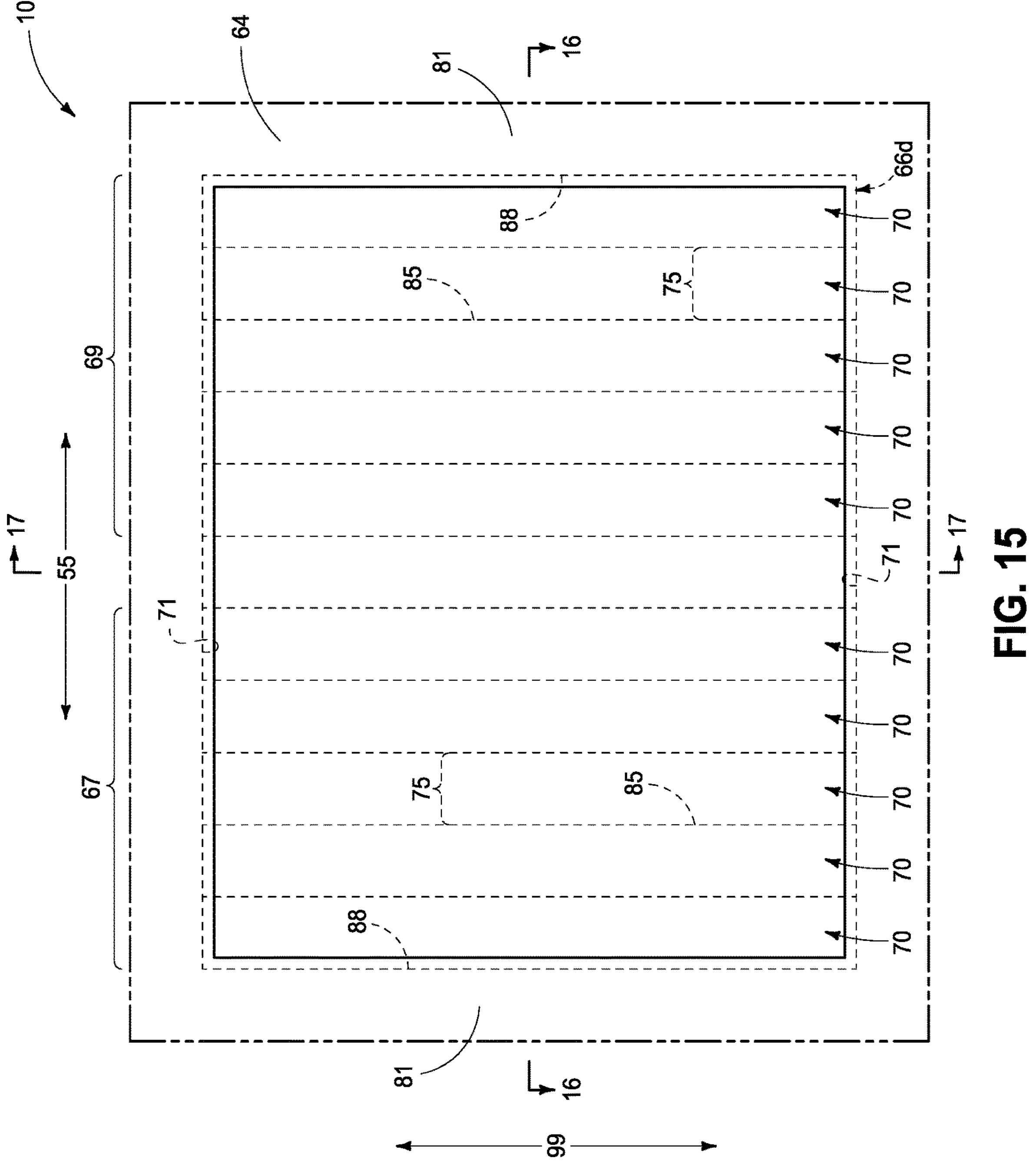
Figure 16:
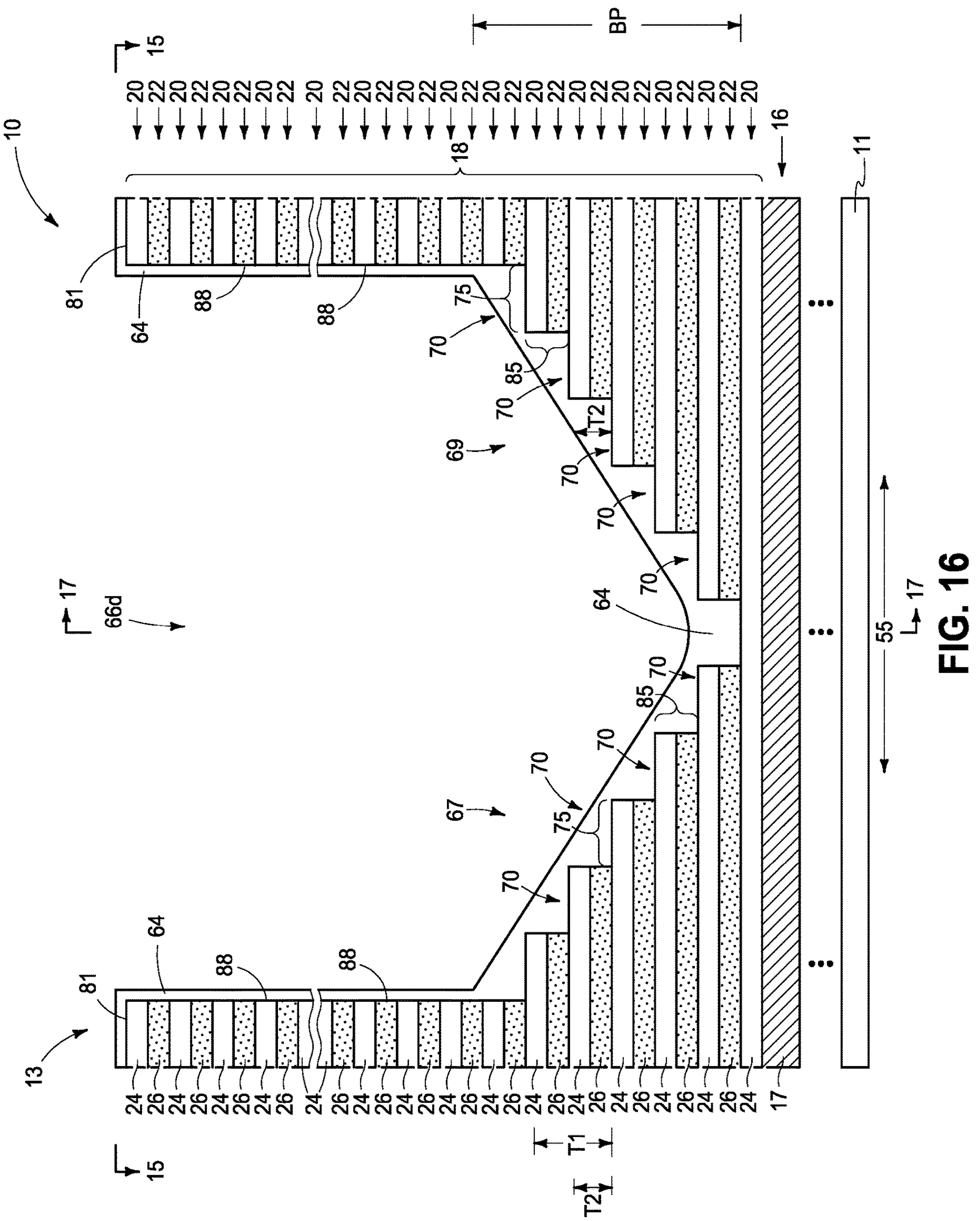
Figure 17:
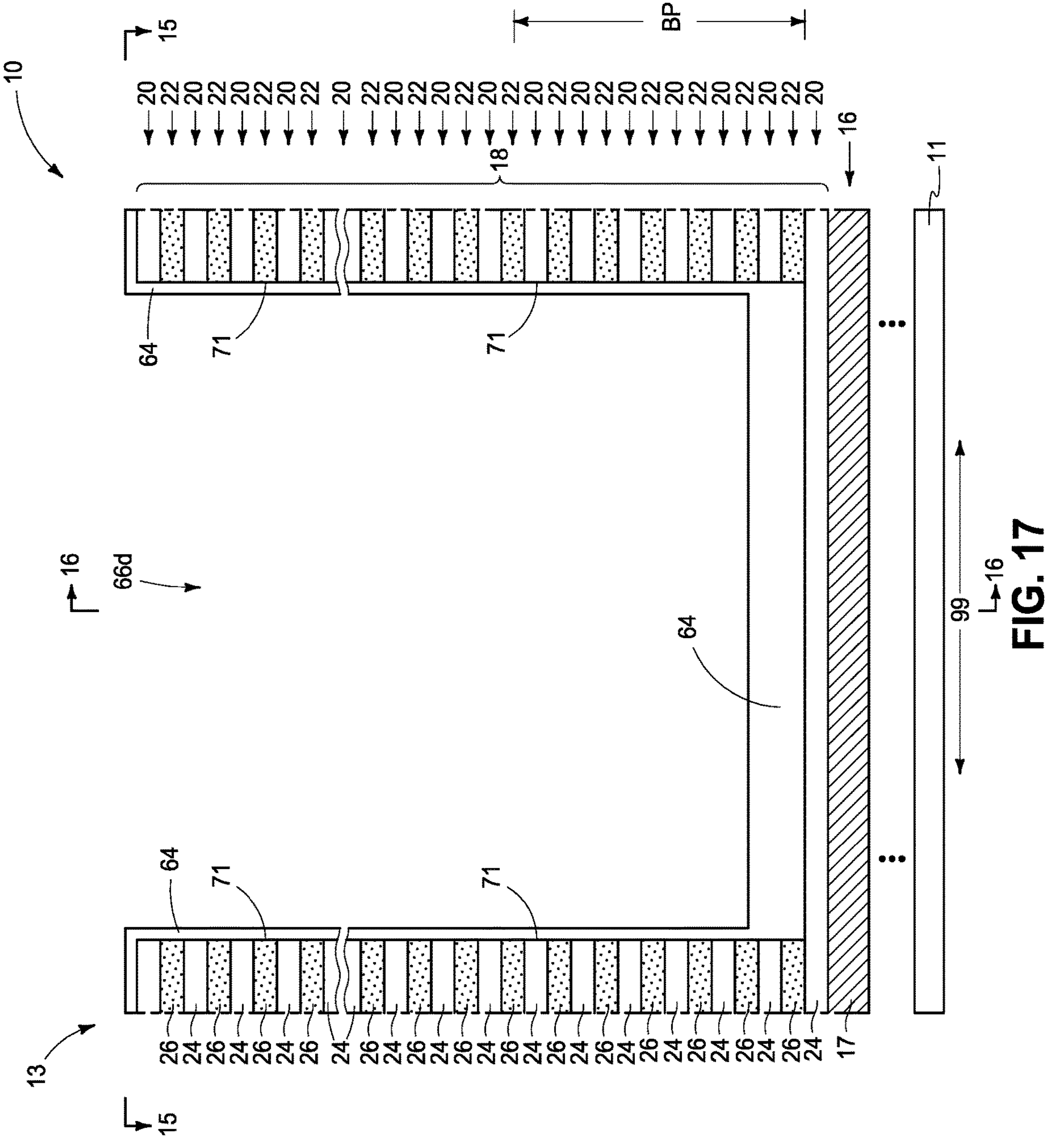
Figure 18:
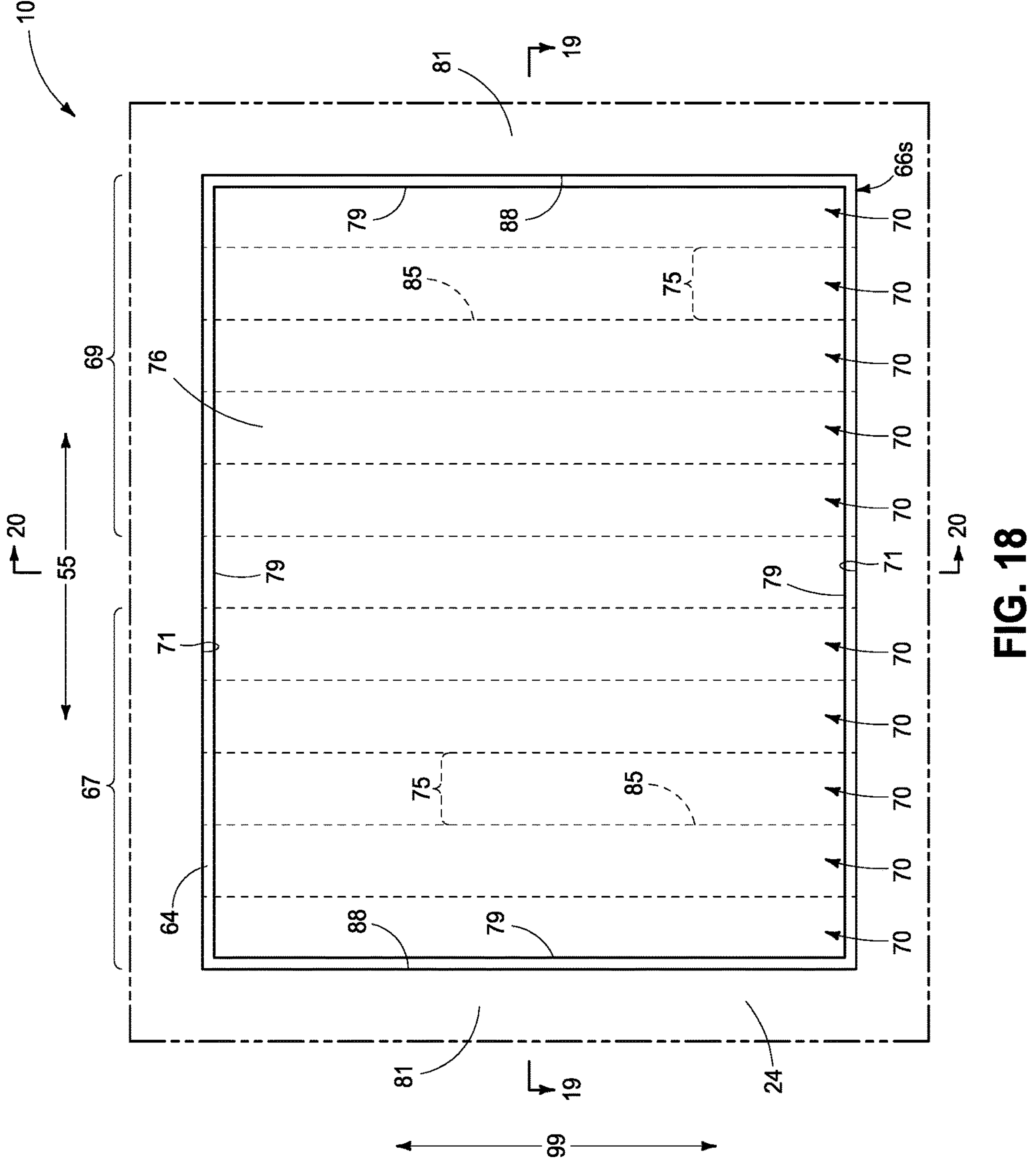
Figure 19:
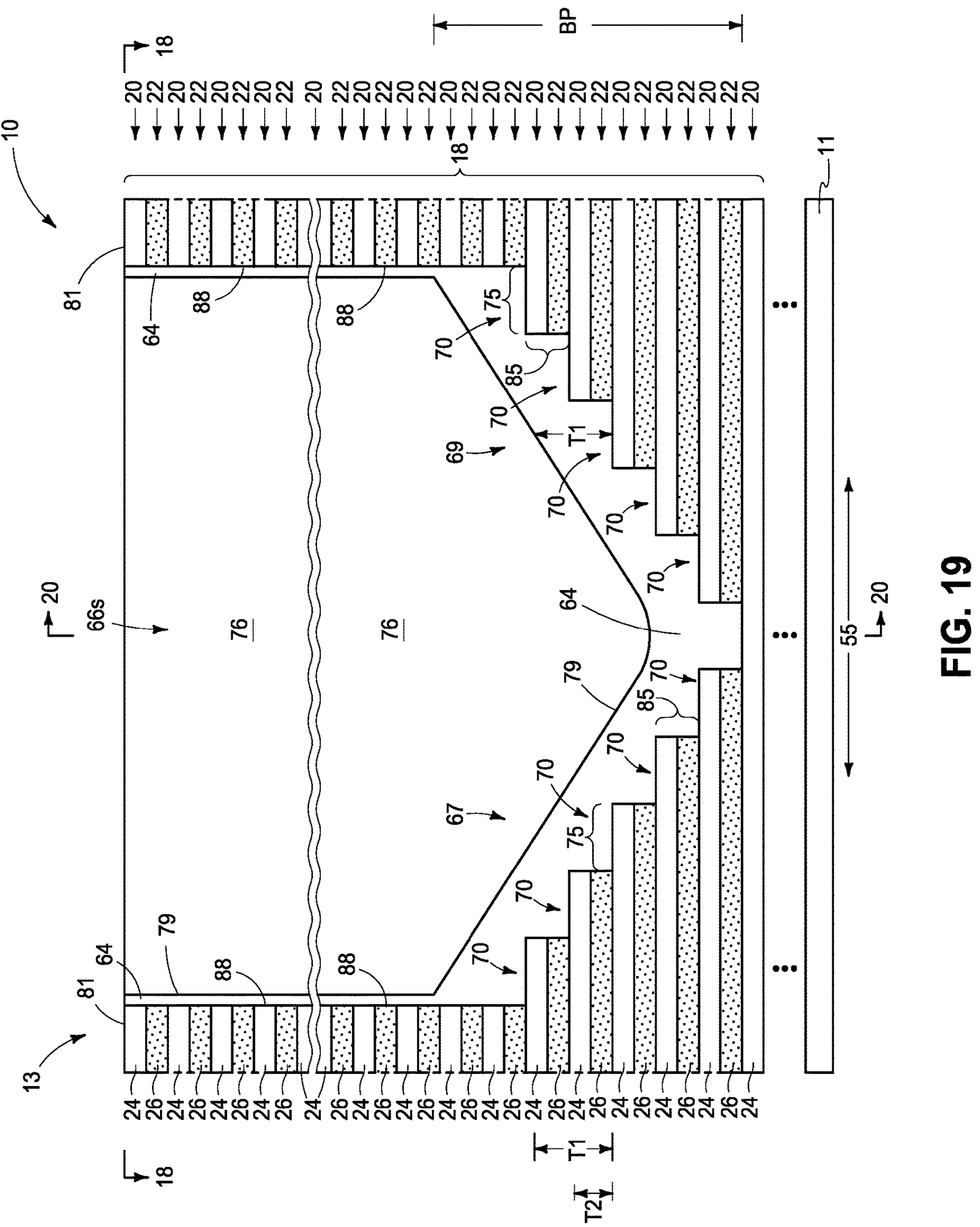
Figure 20:
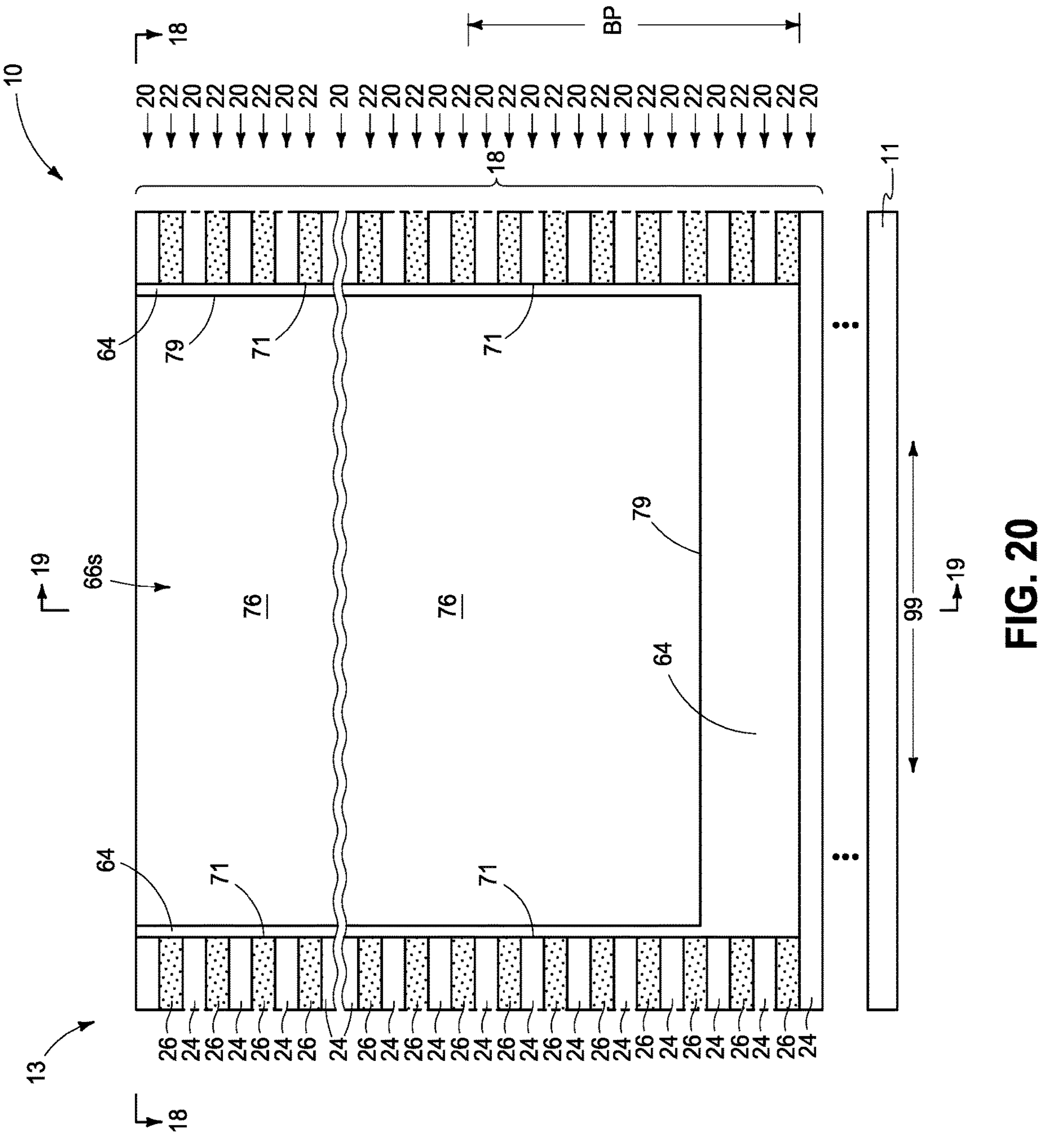
Figure 21:
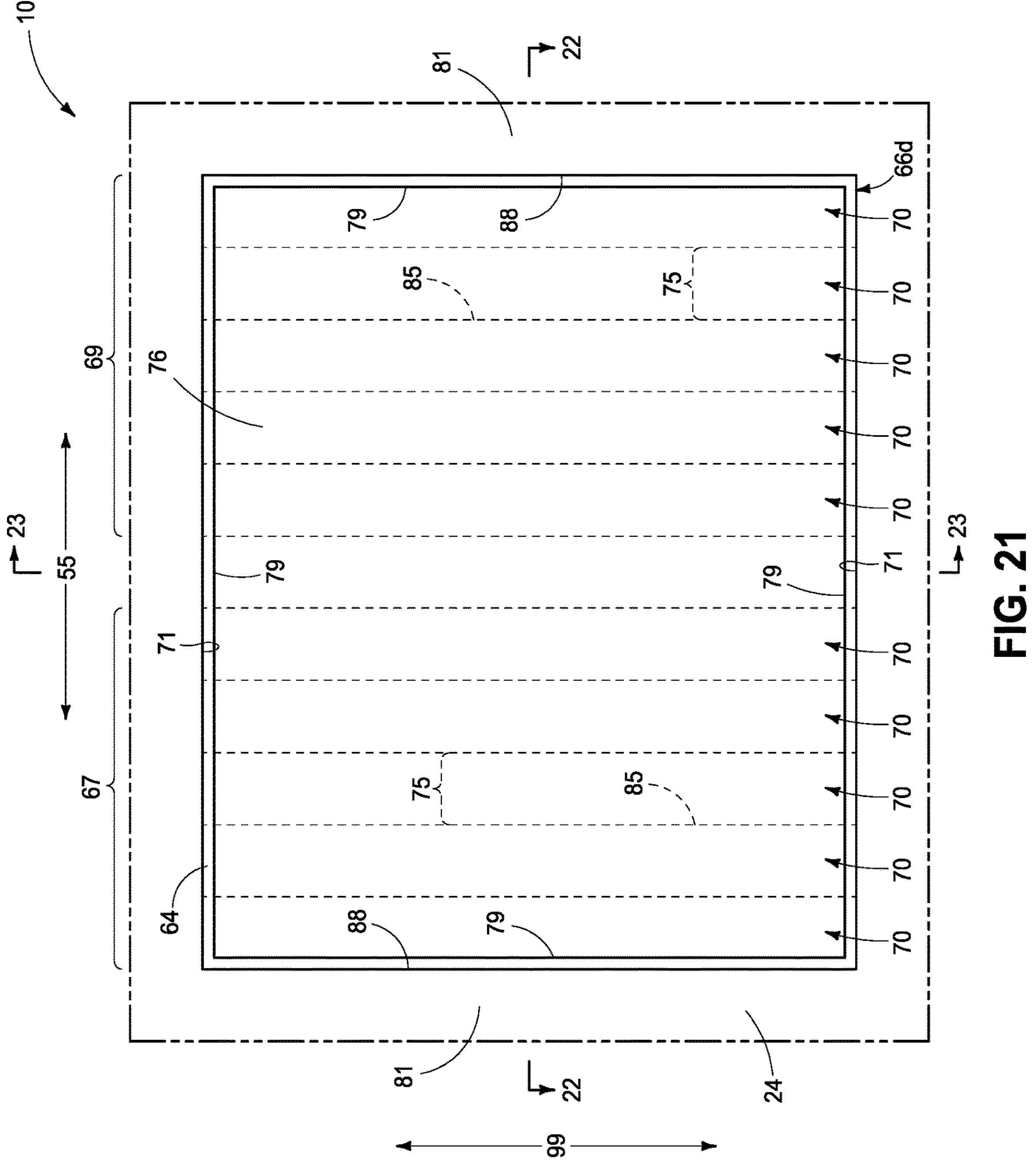
Figure 22:
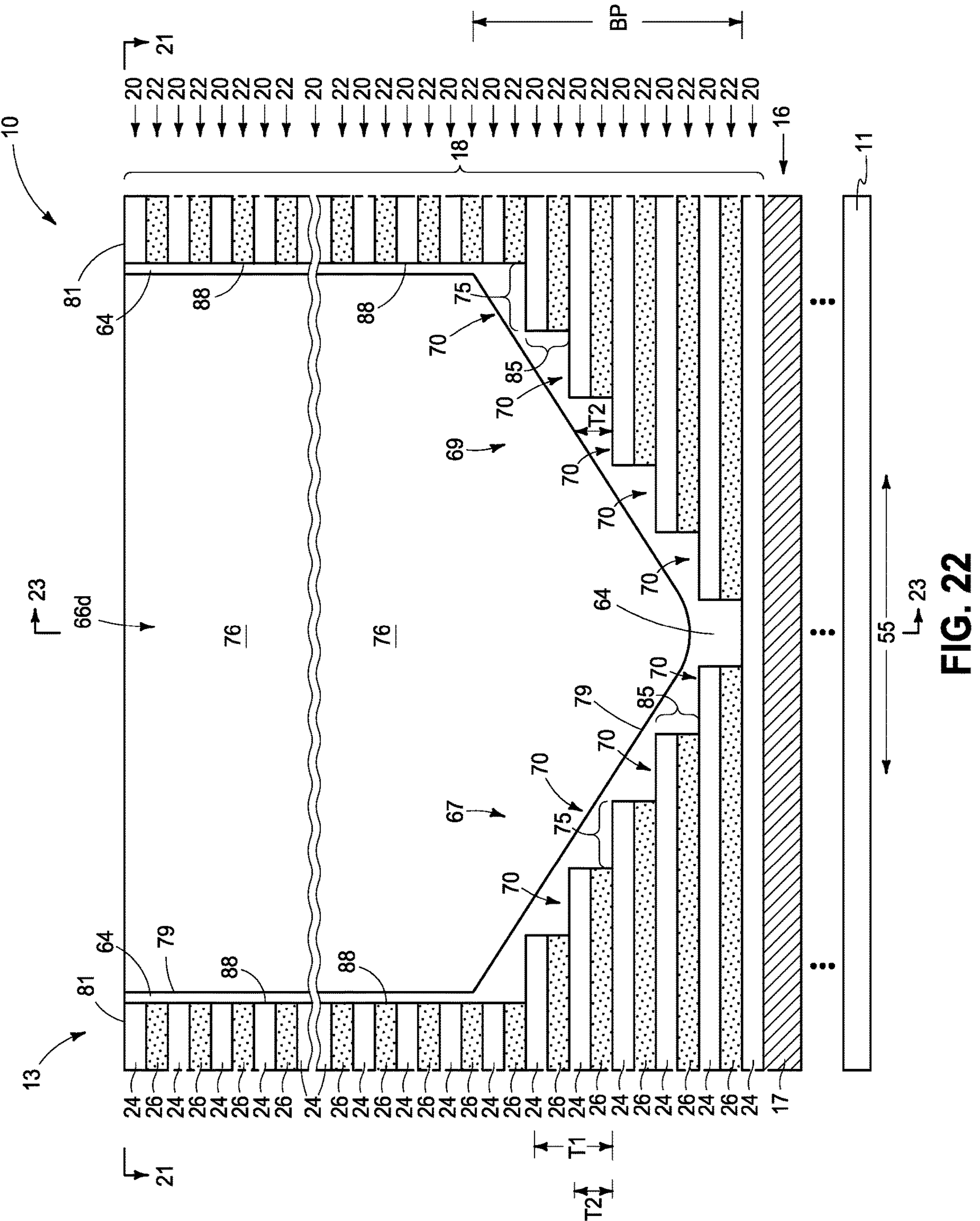
Figure 23:
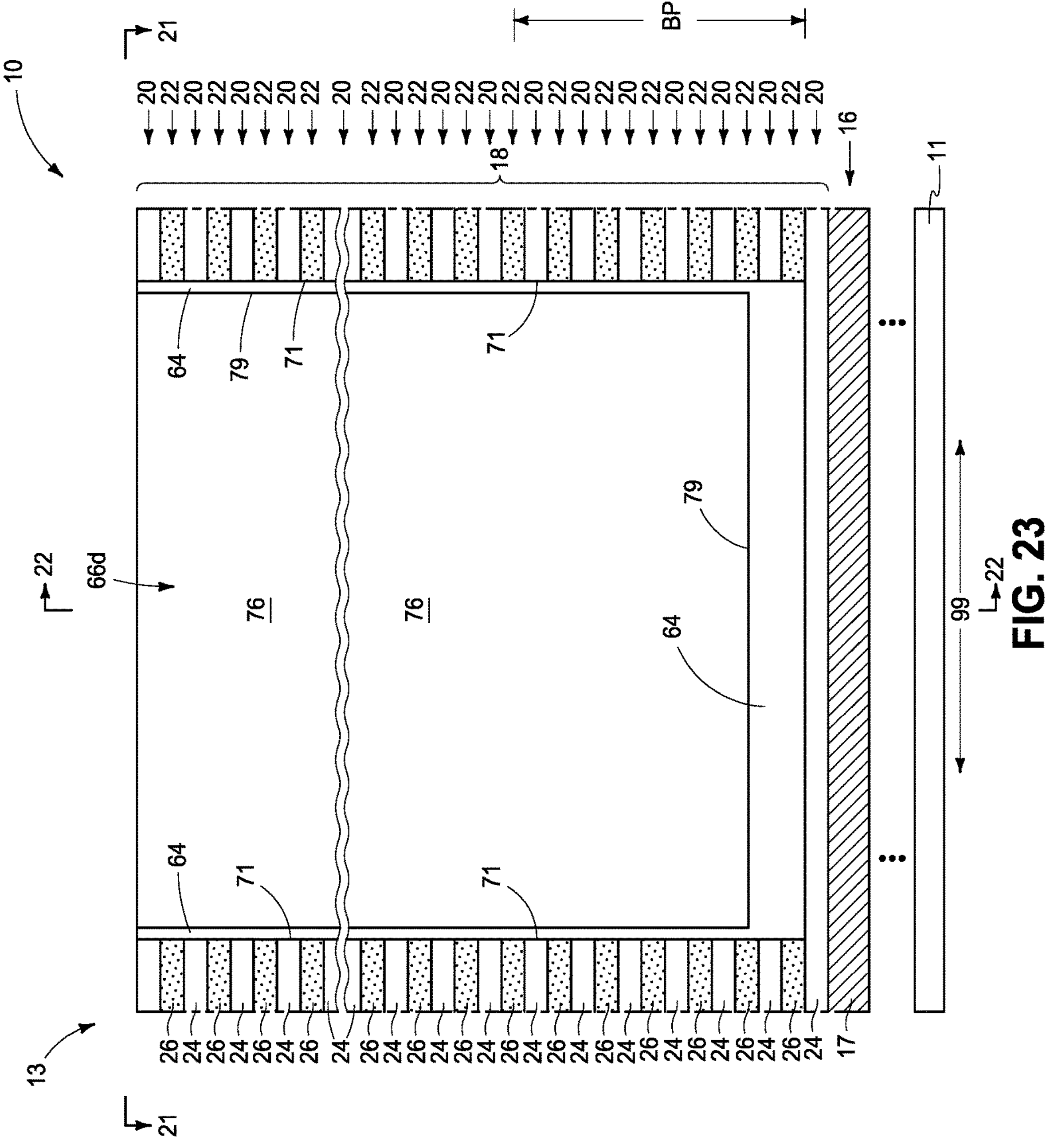
Figure 24:
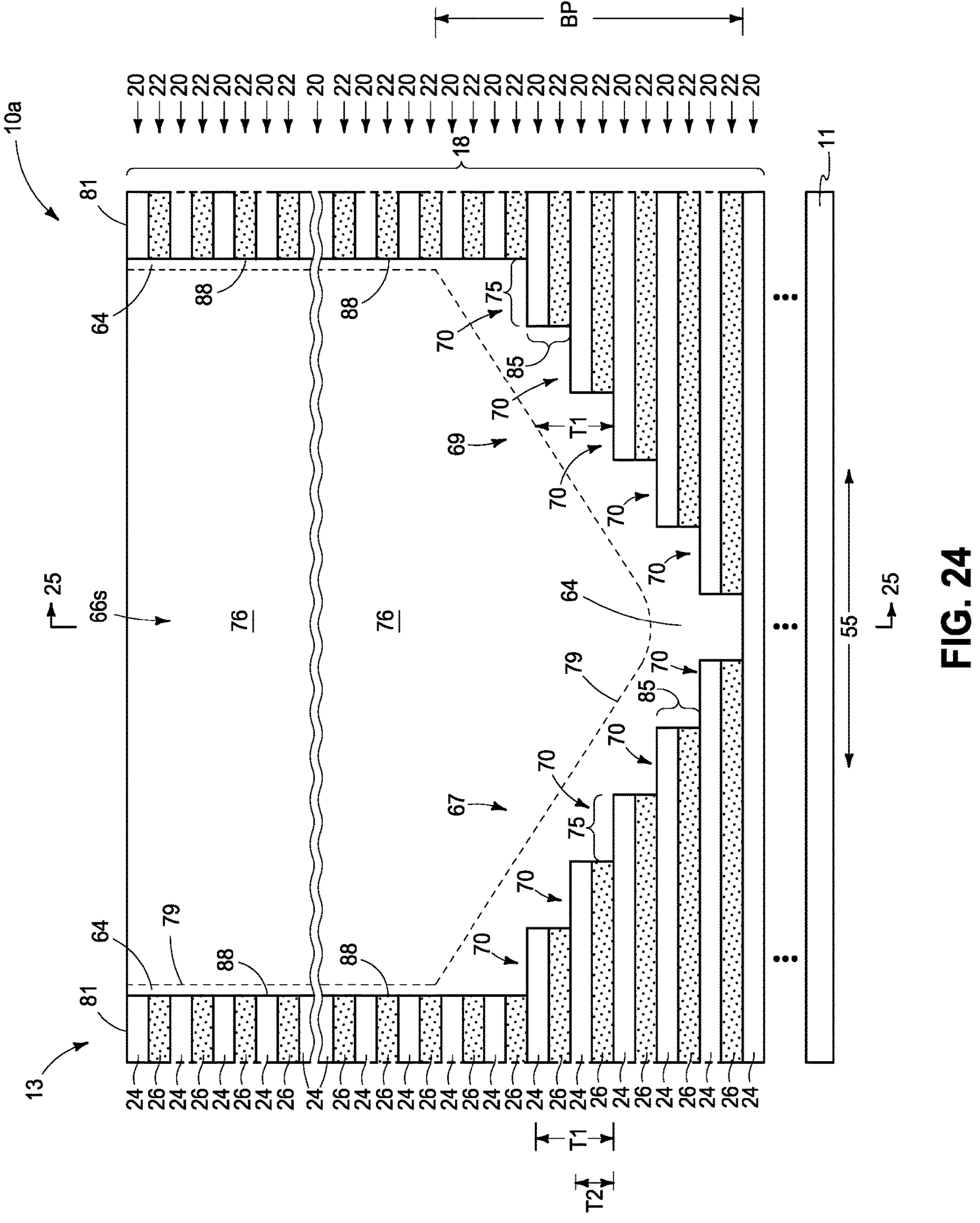
Figure 25:
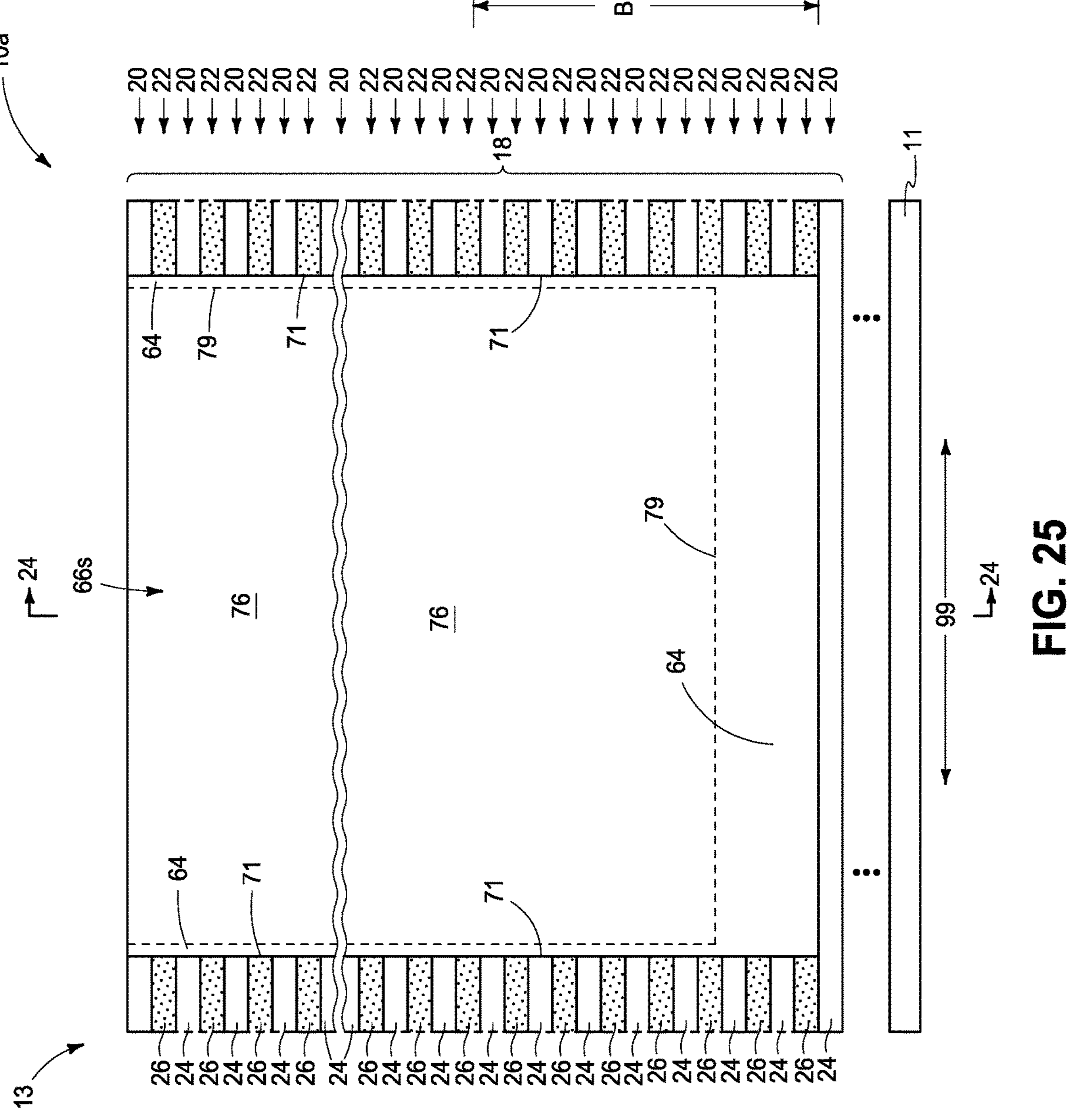
Figure 26:
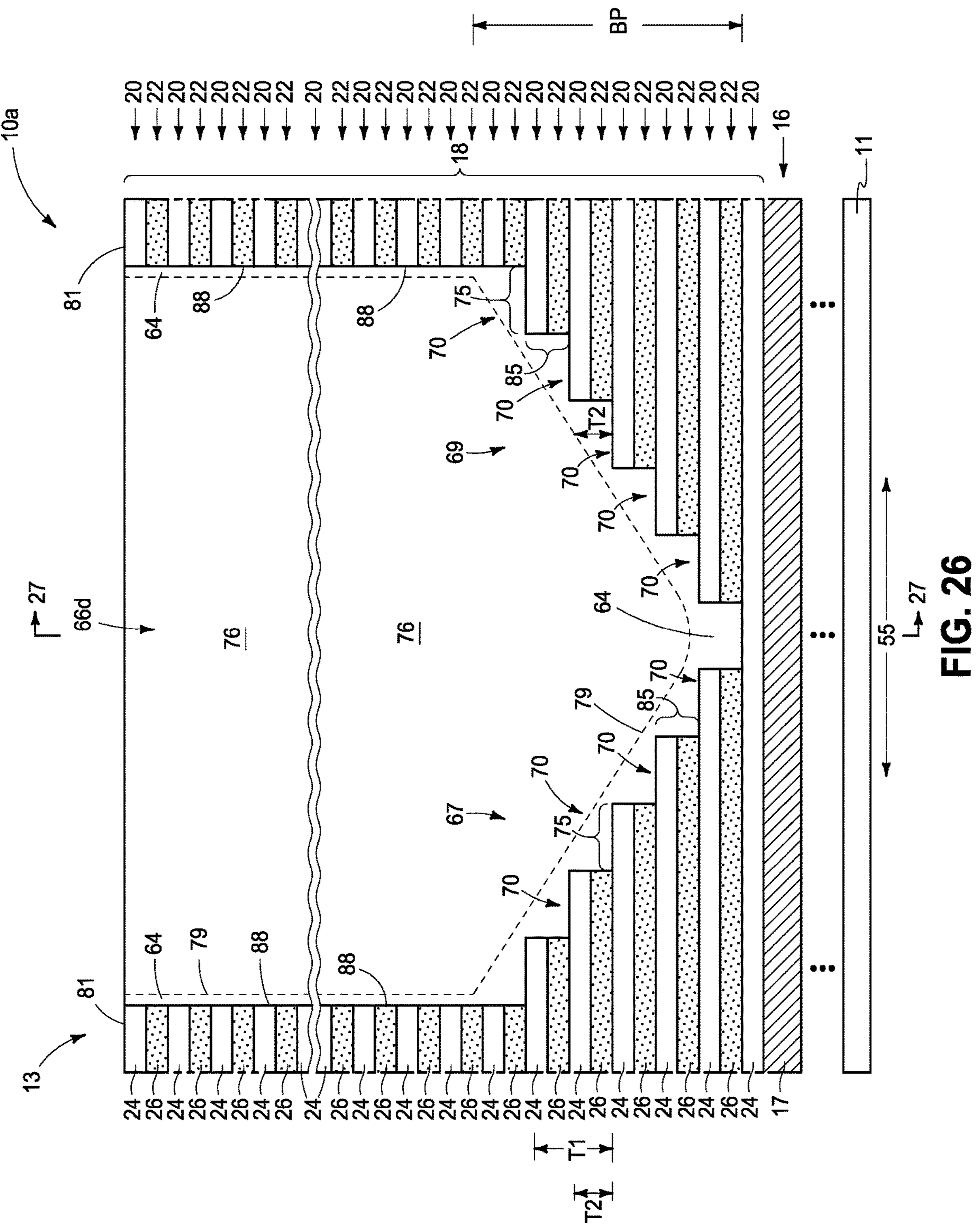
Figure 27:
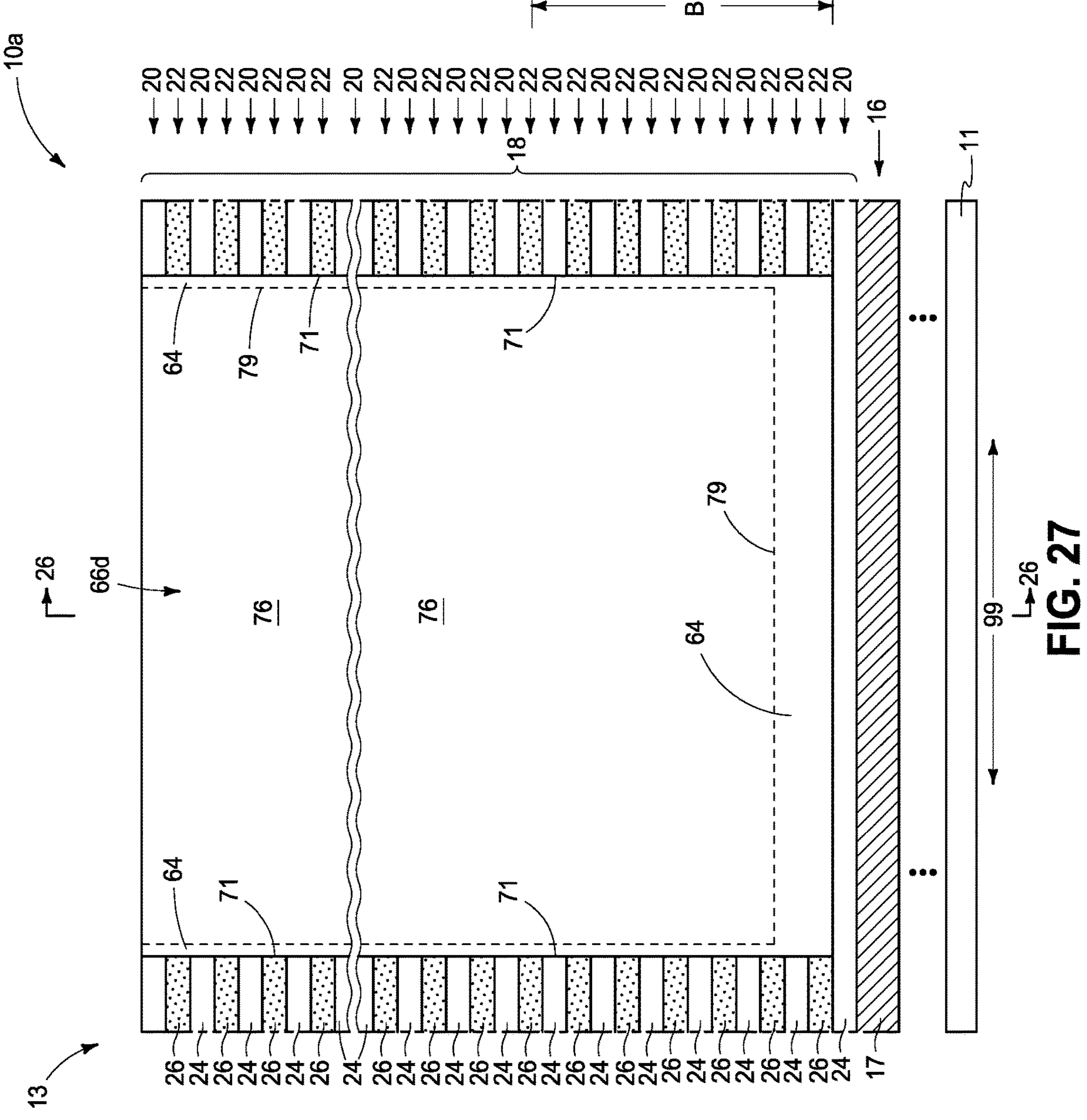
Figure 28:
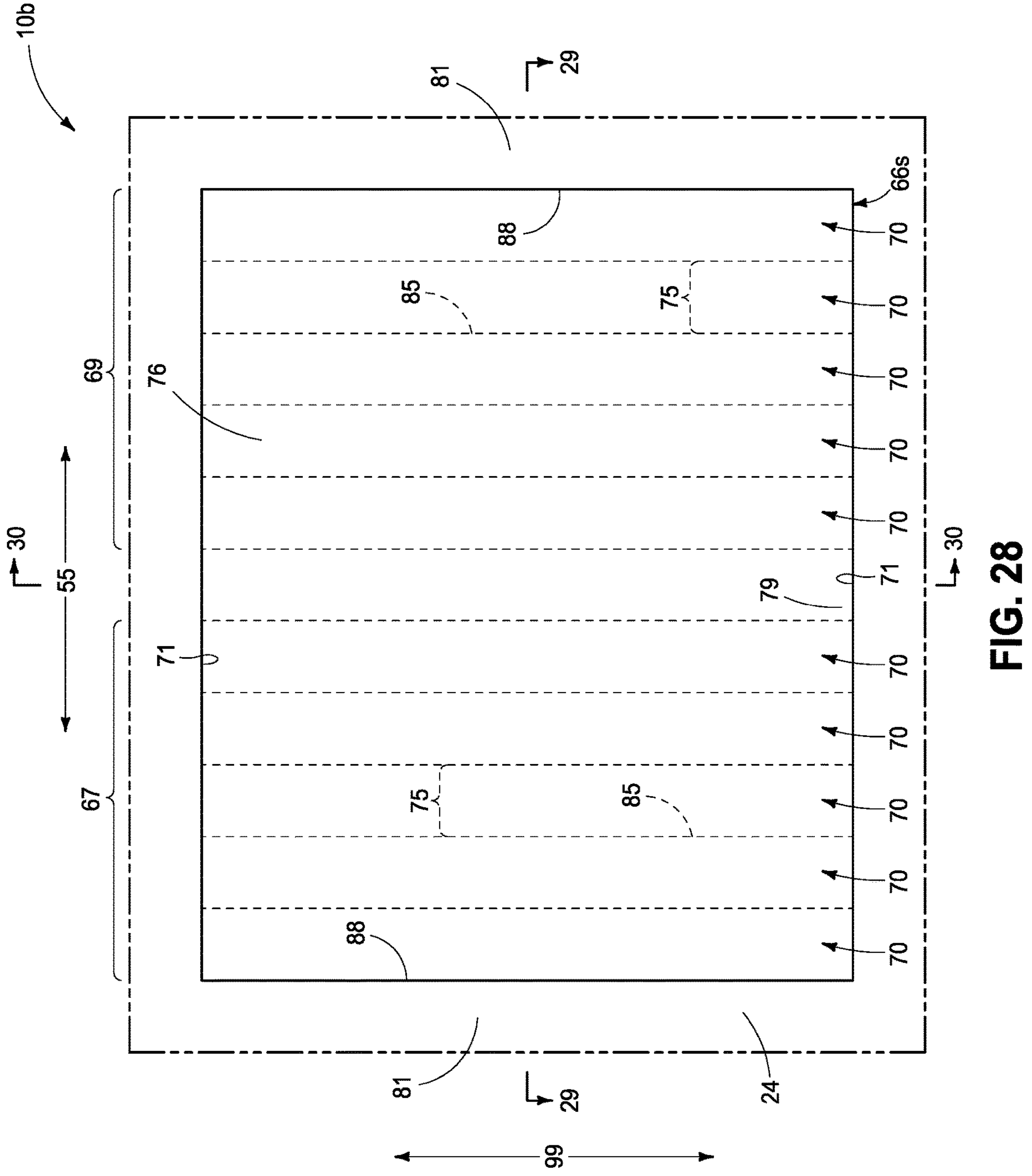
Figure 29:
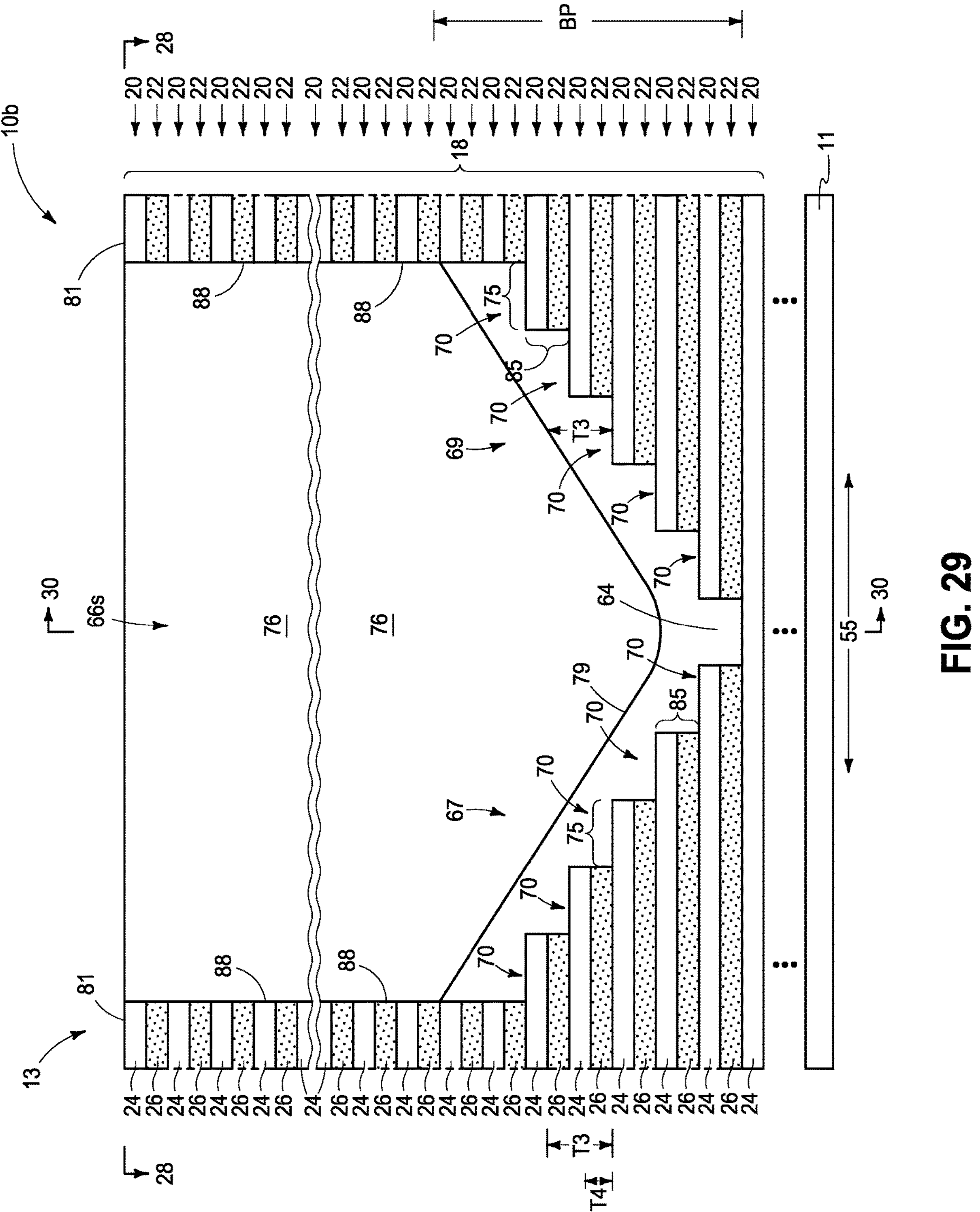
Figure 30:
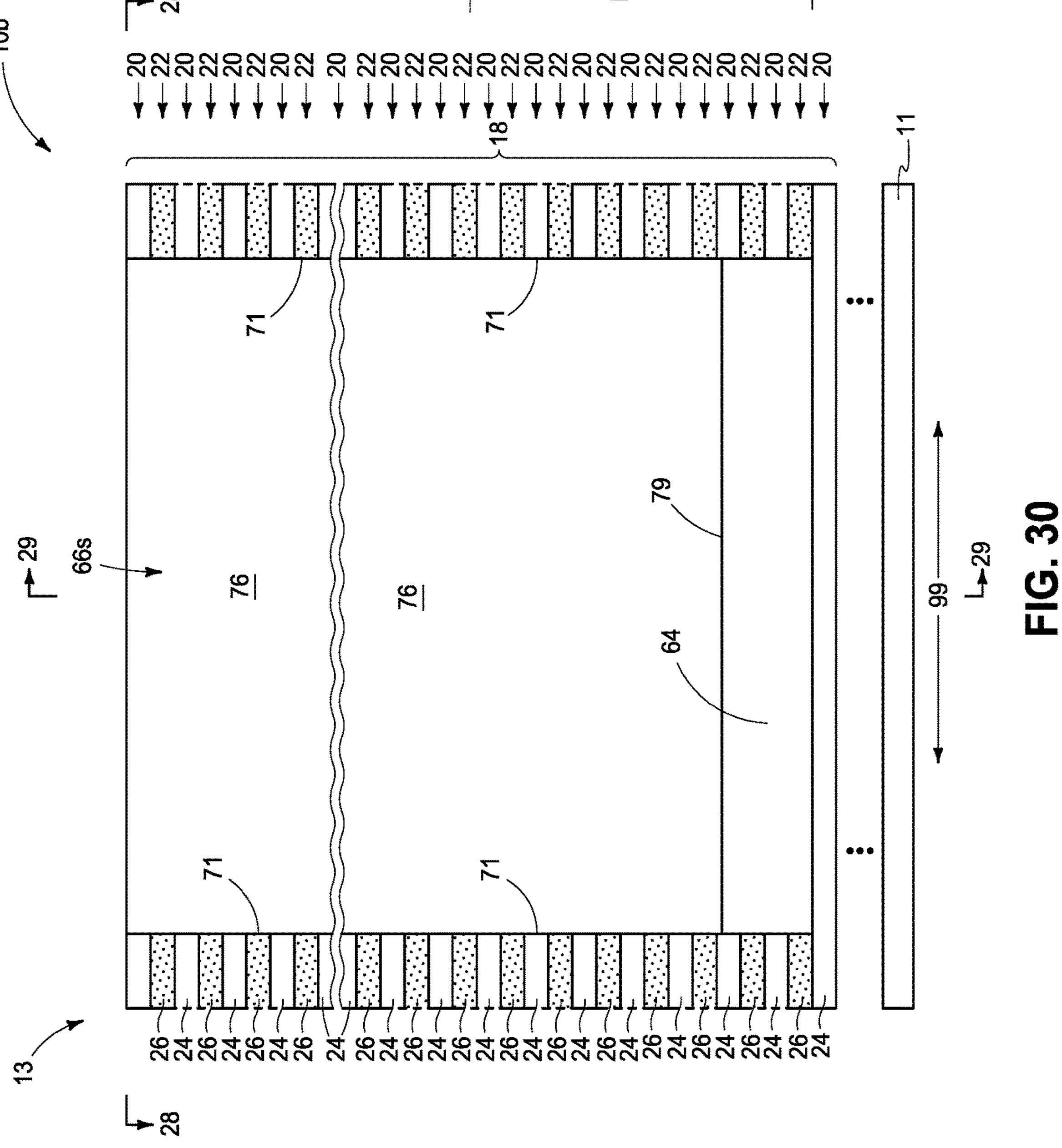
Figure 31:
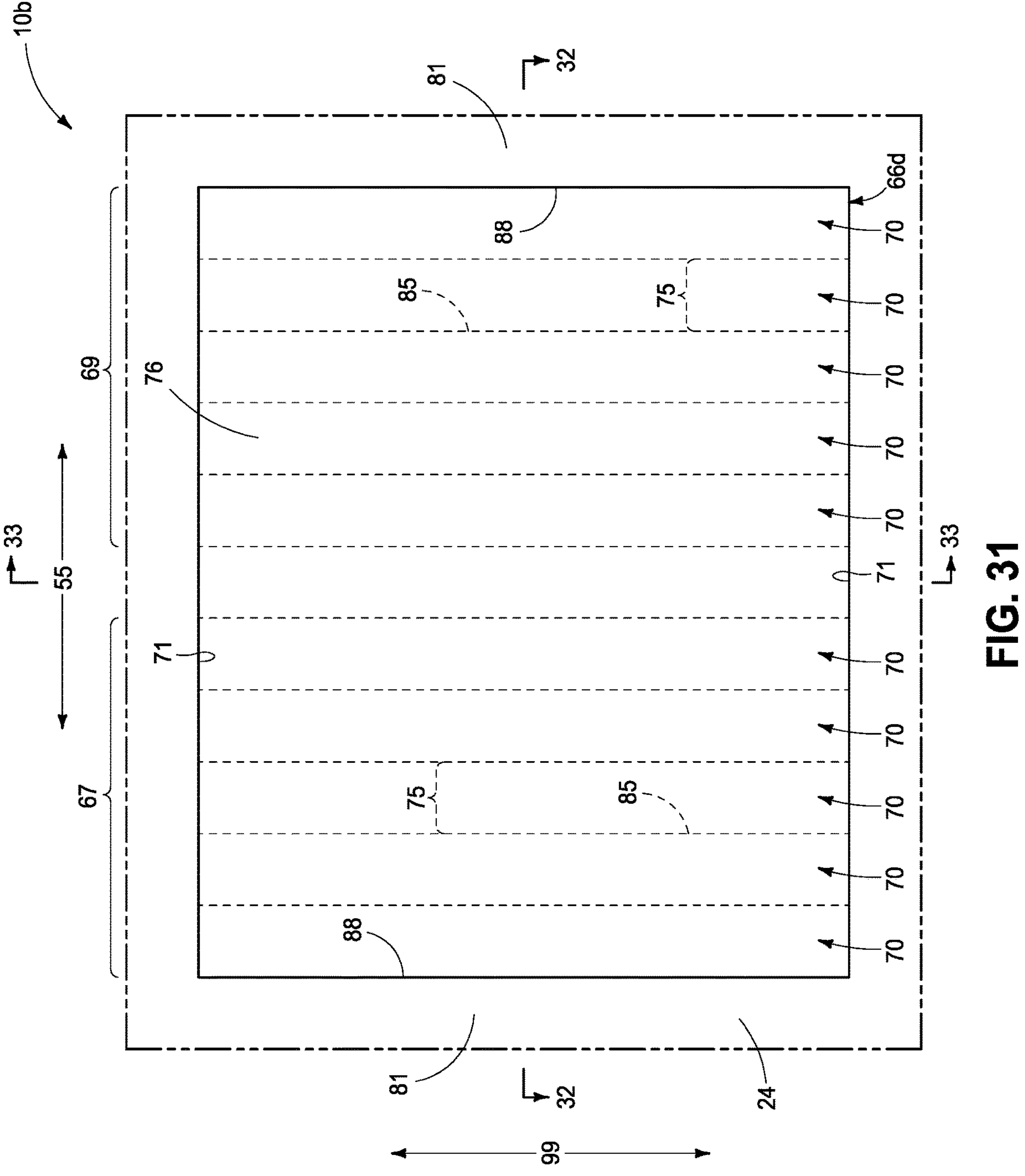
Figure 32:
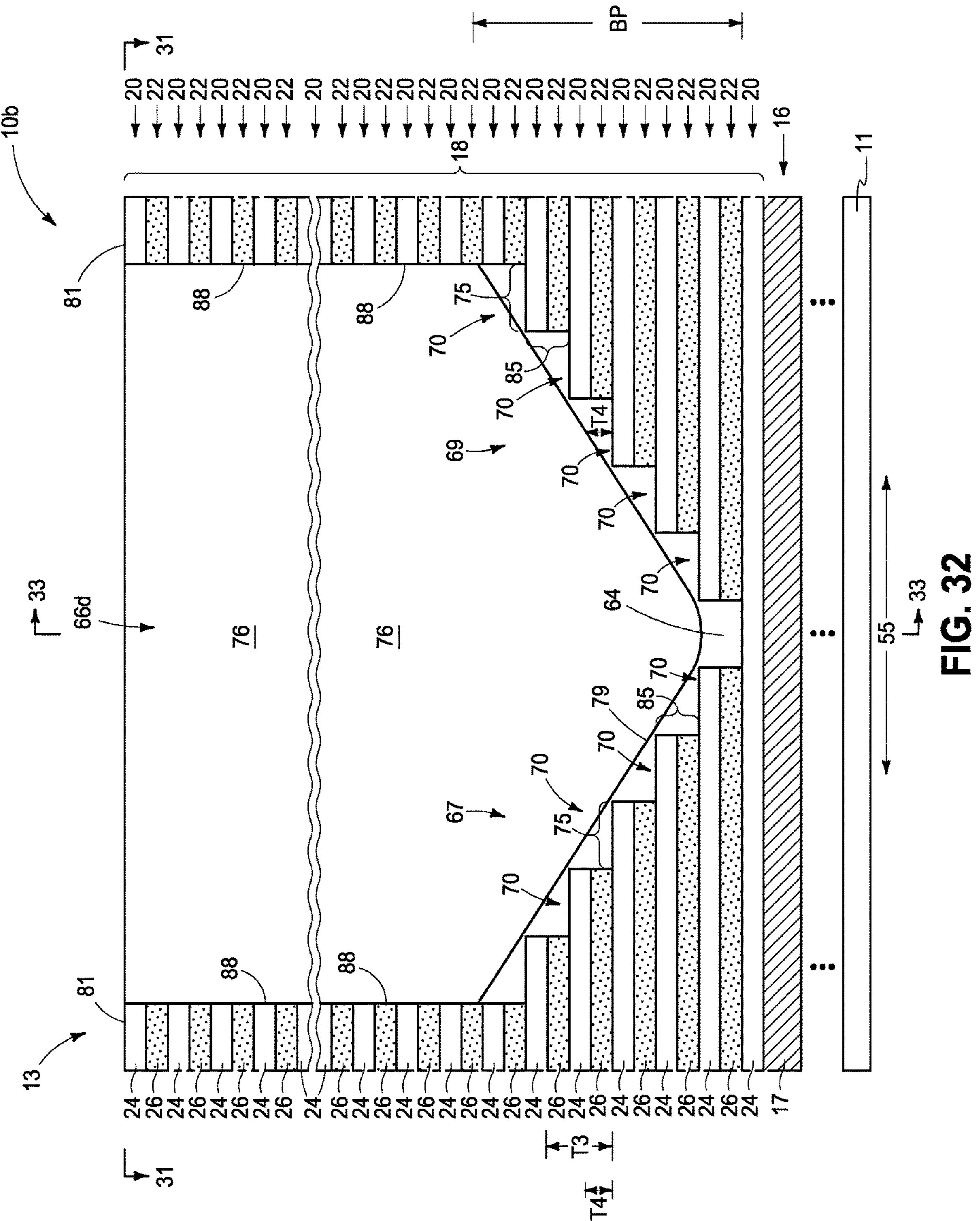
Figure 33:
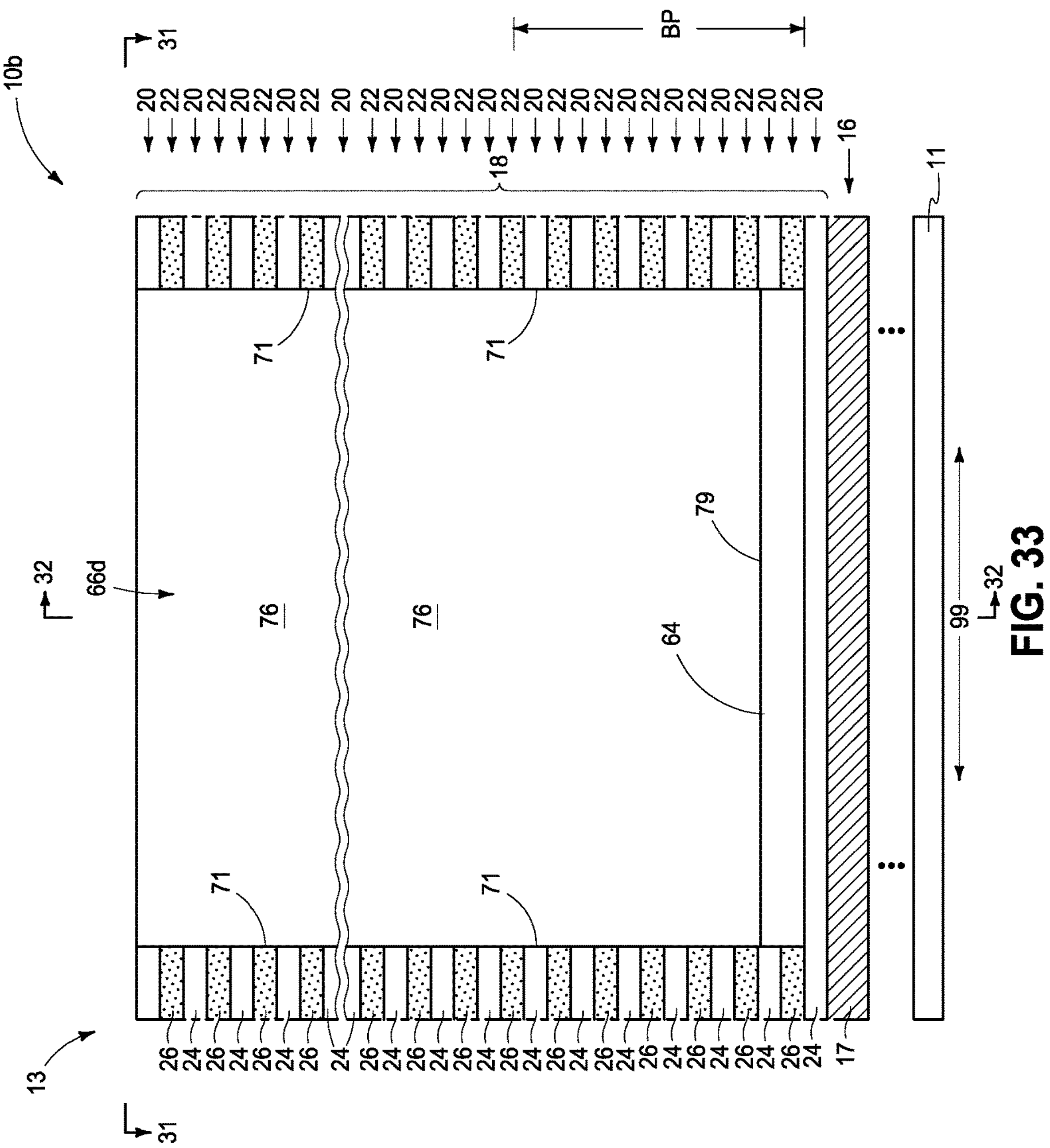
Figure 34:
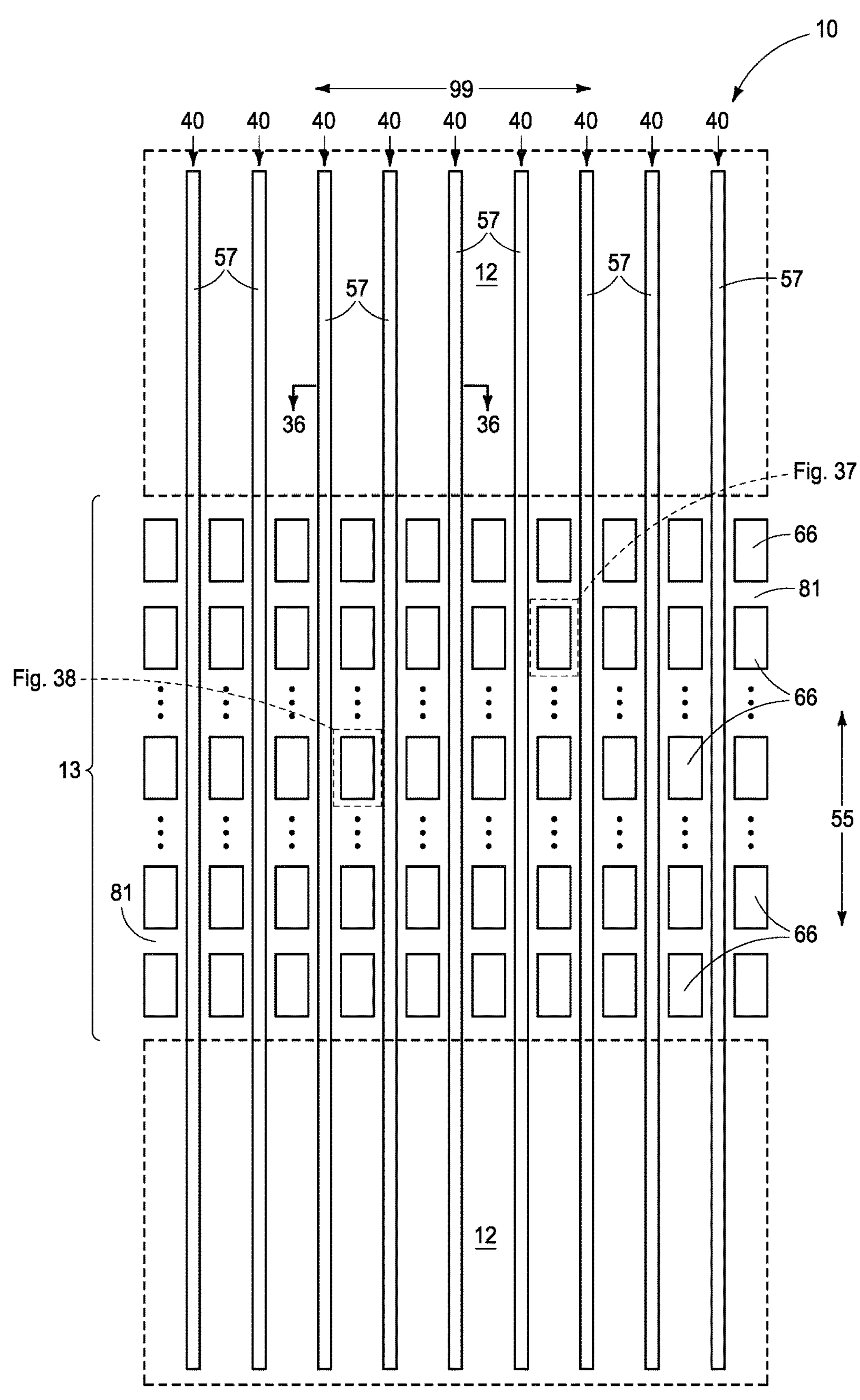
Figures 35, 36:
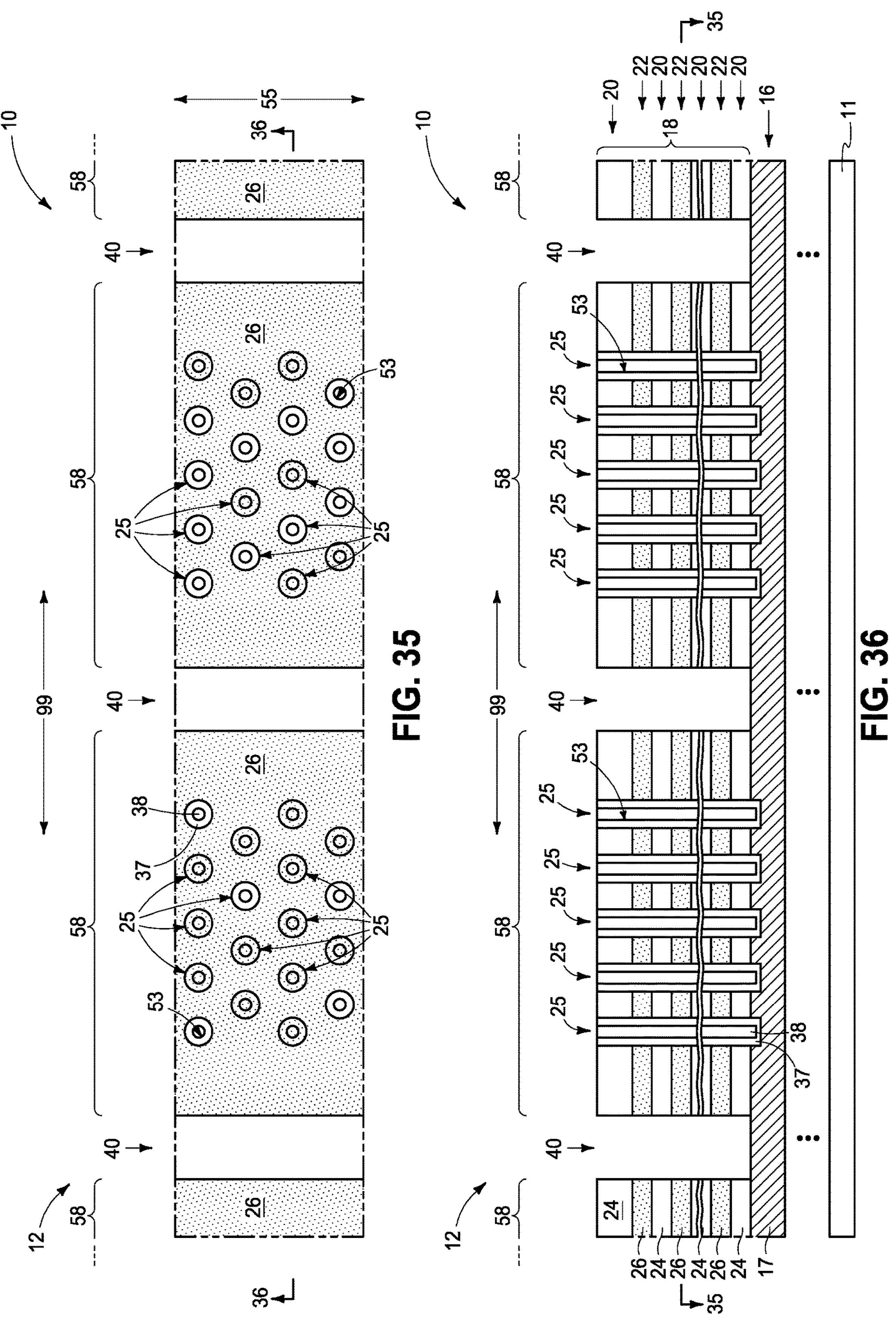
Figure 37:
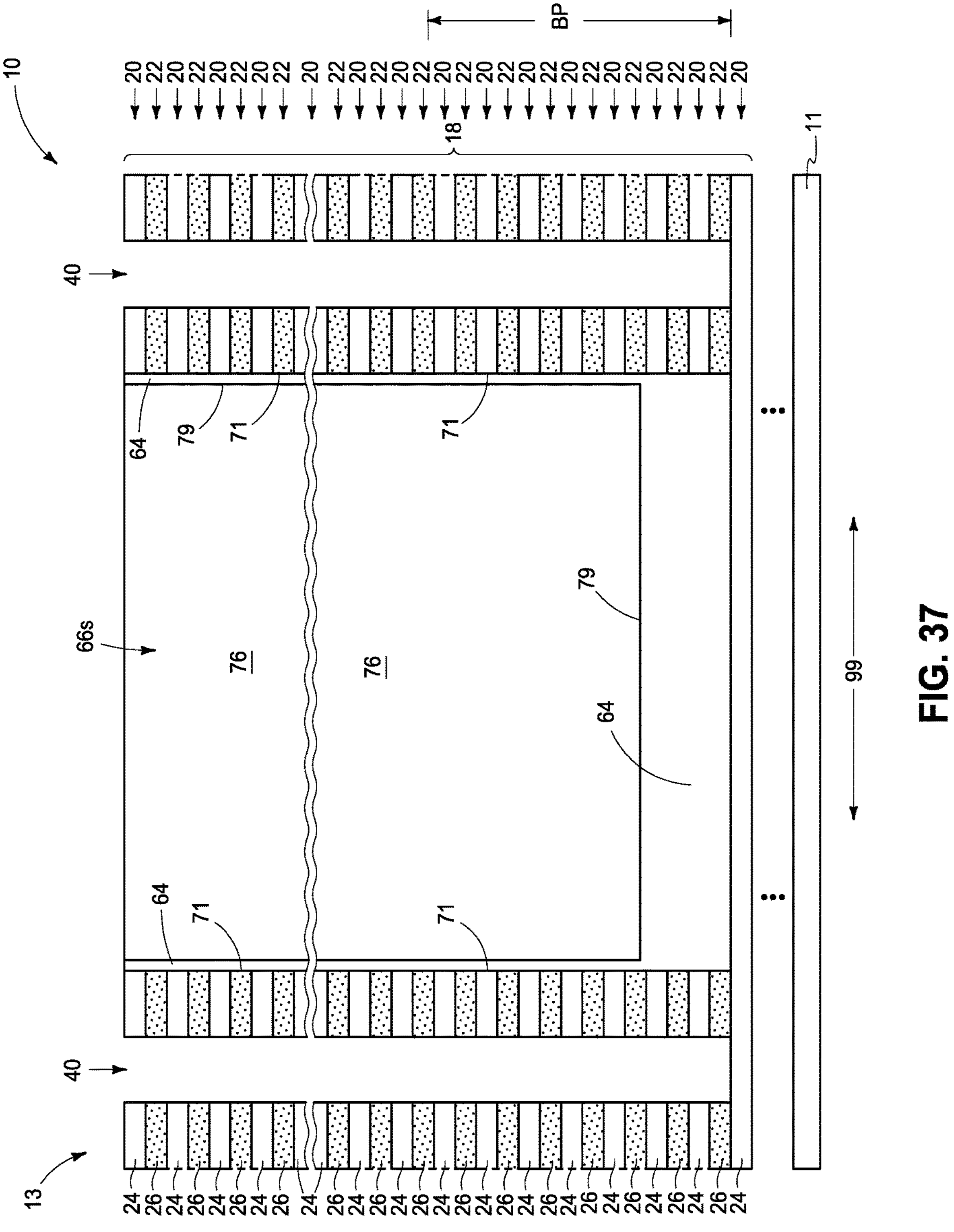
Figure 38:
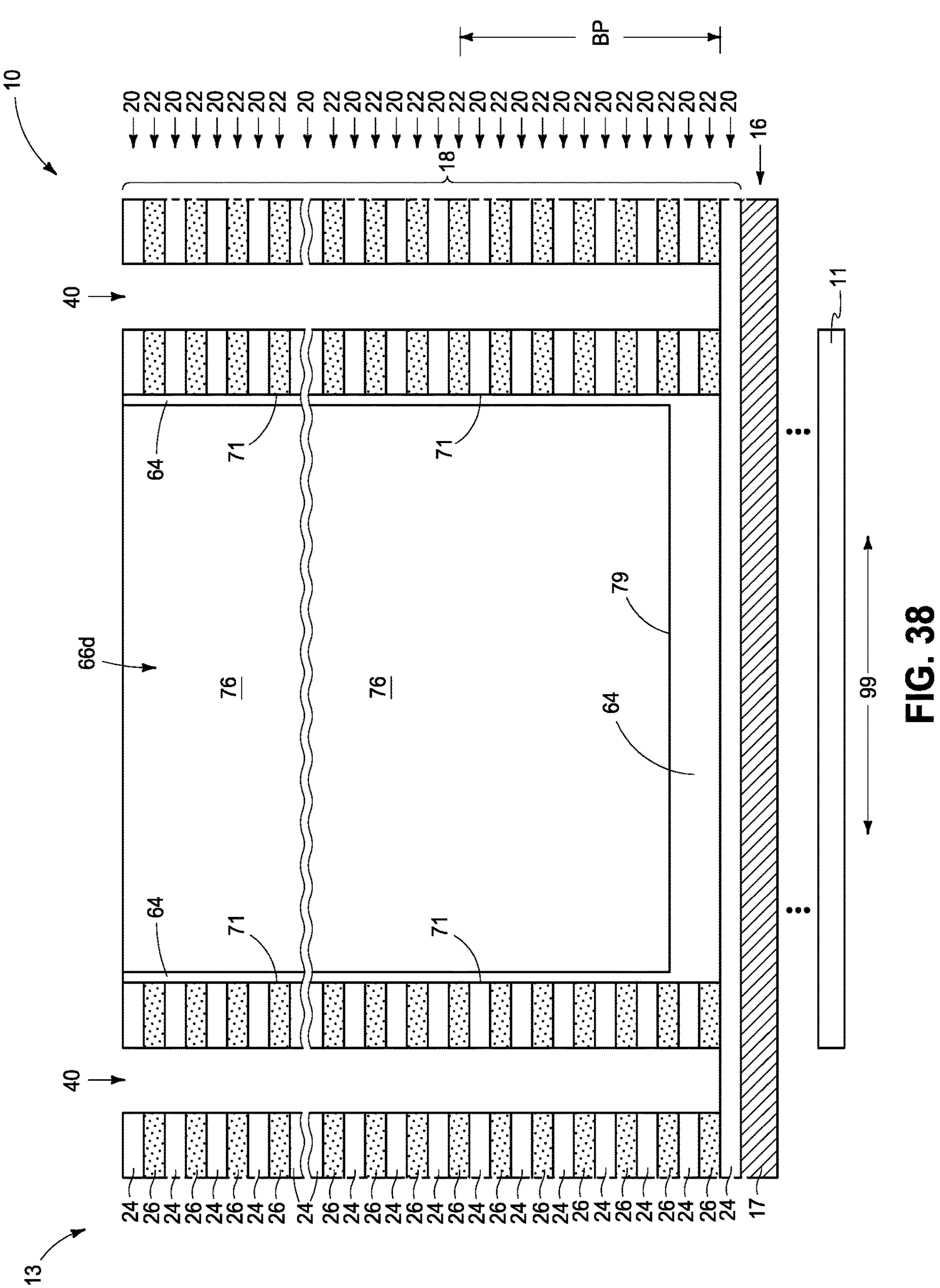
Figure 39:
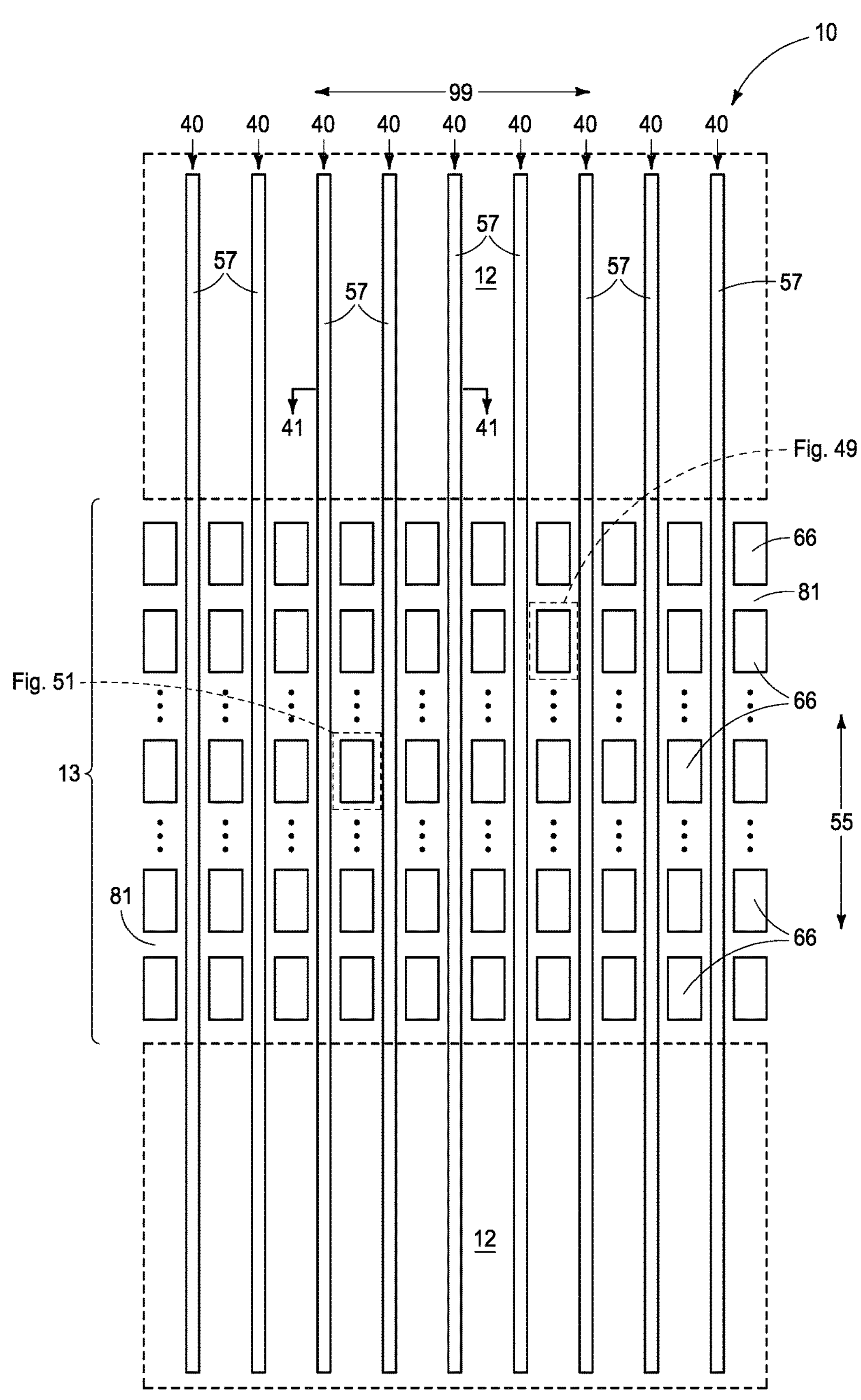
Figures 40, 41, 42, 43, 44:
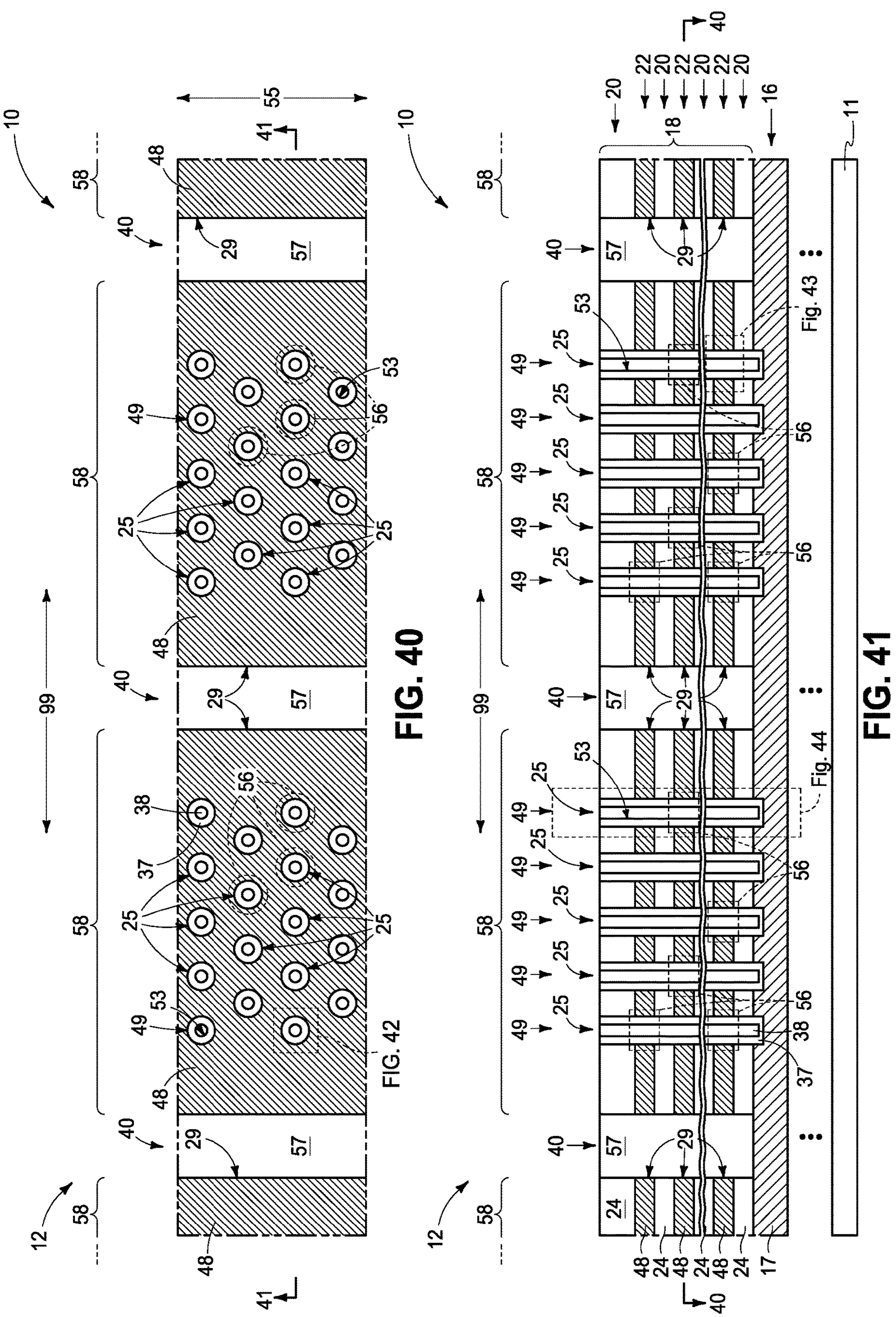
Figure 45:
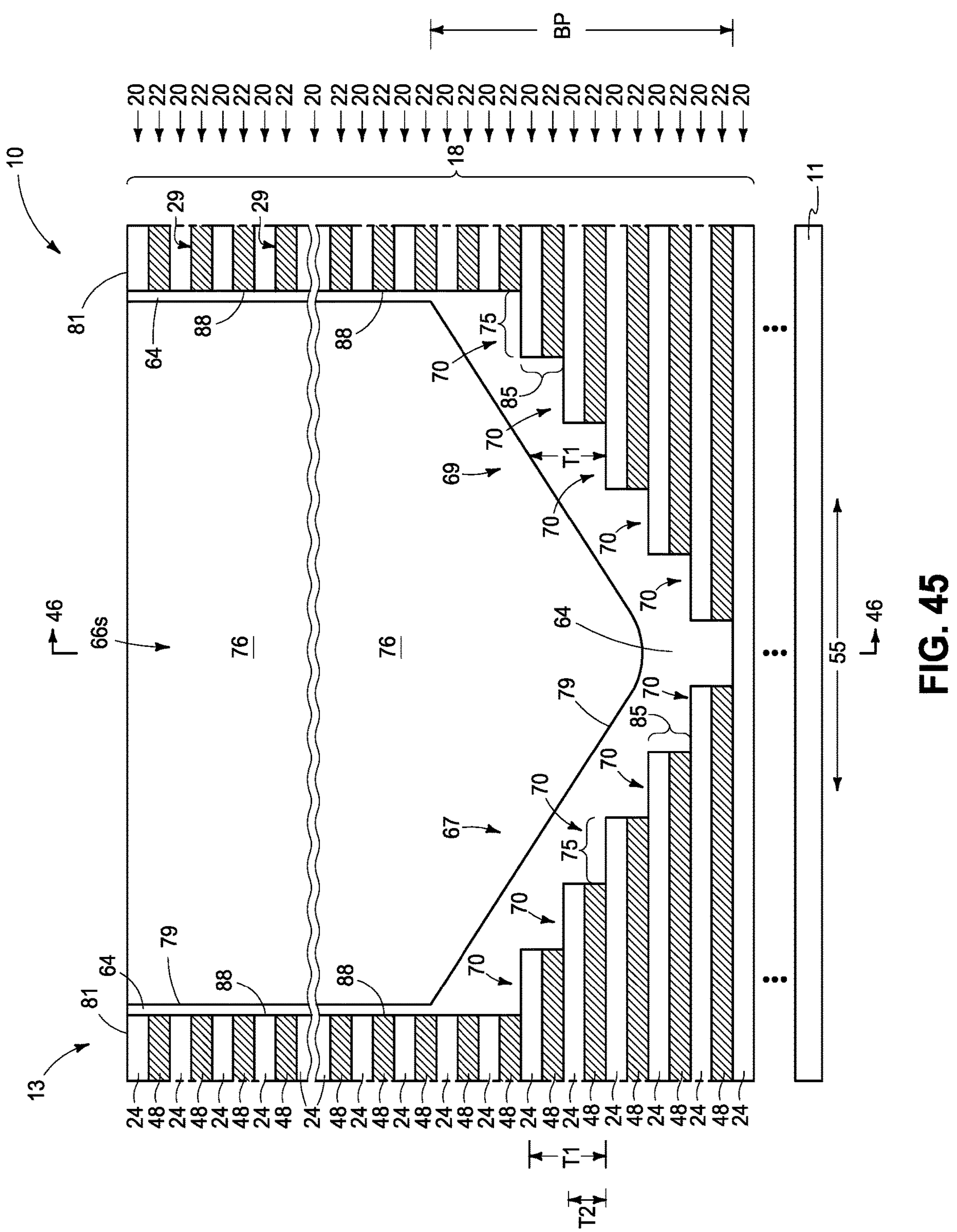
Figure 46:
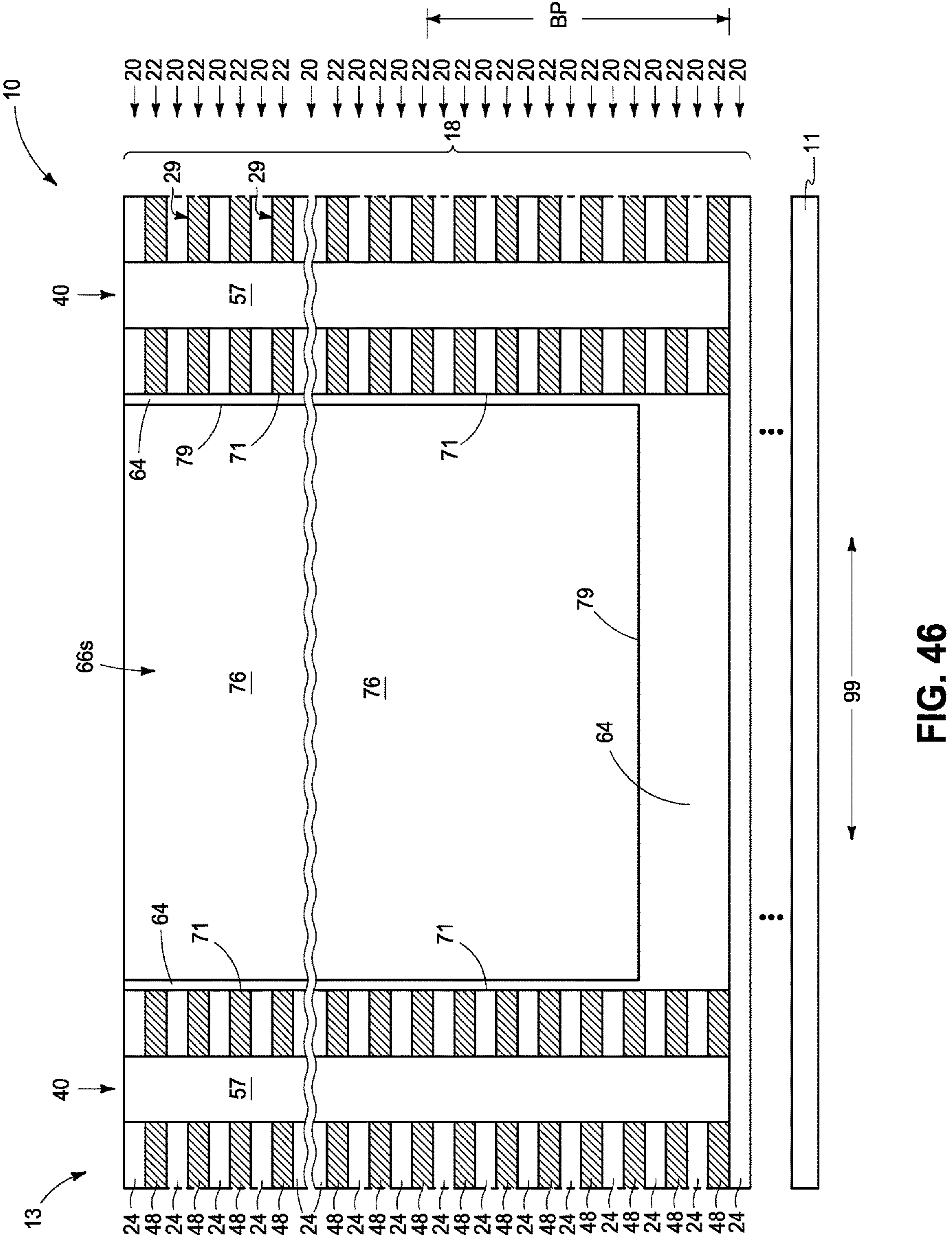
Figure 47:
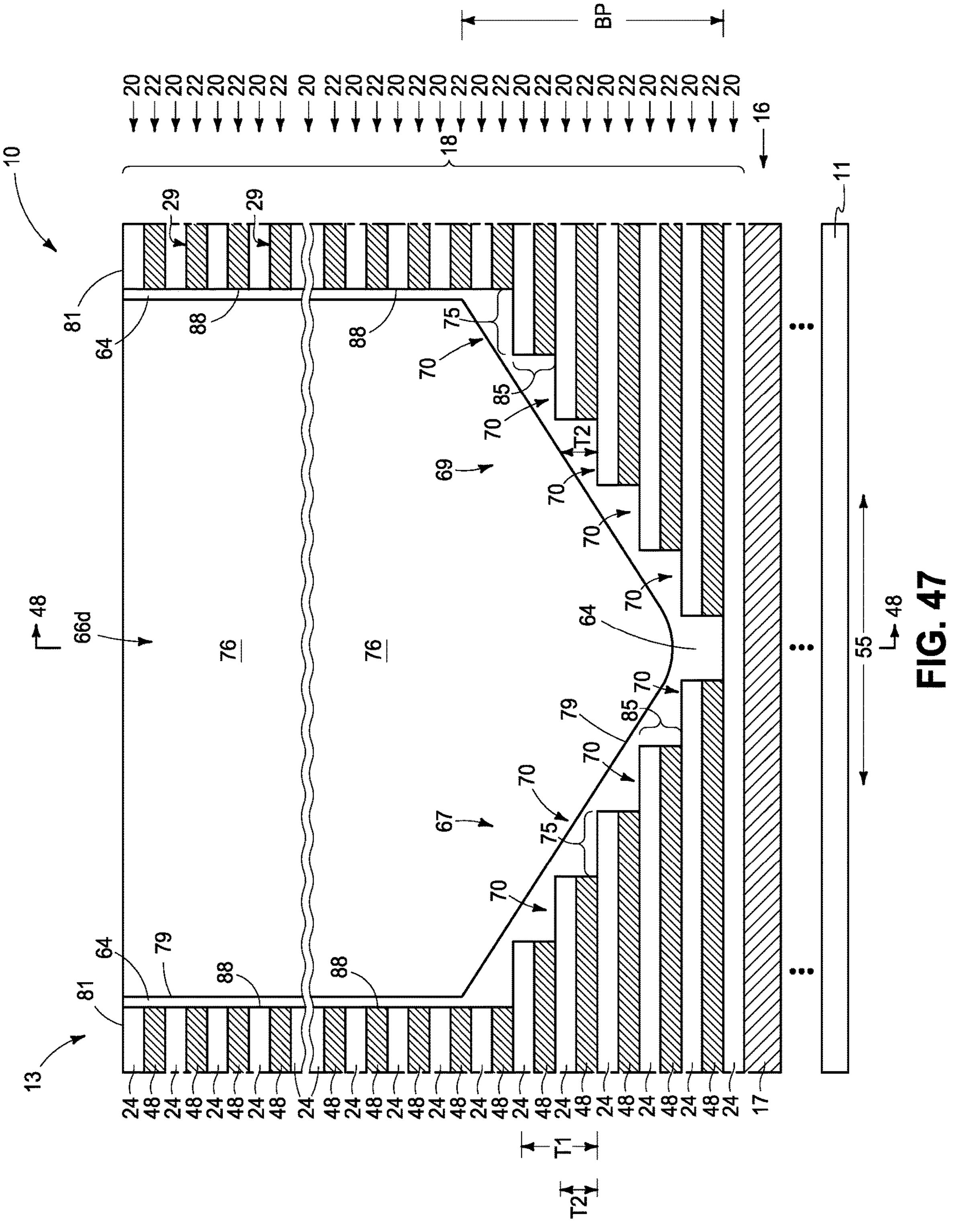
Figure 48:
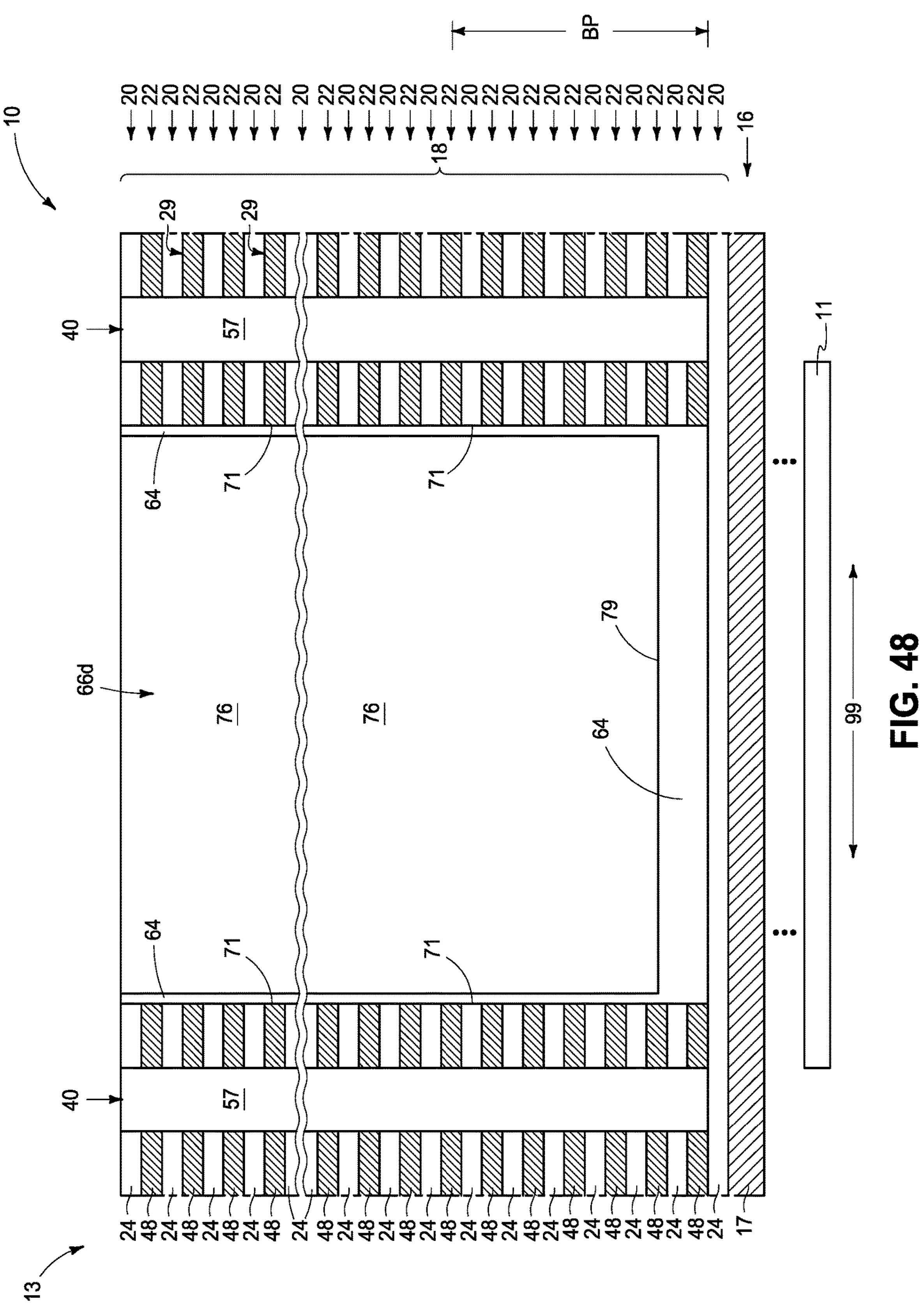
Figure 49:
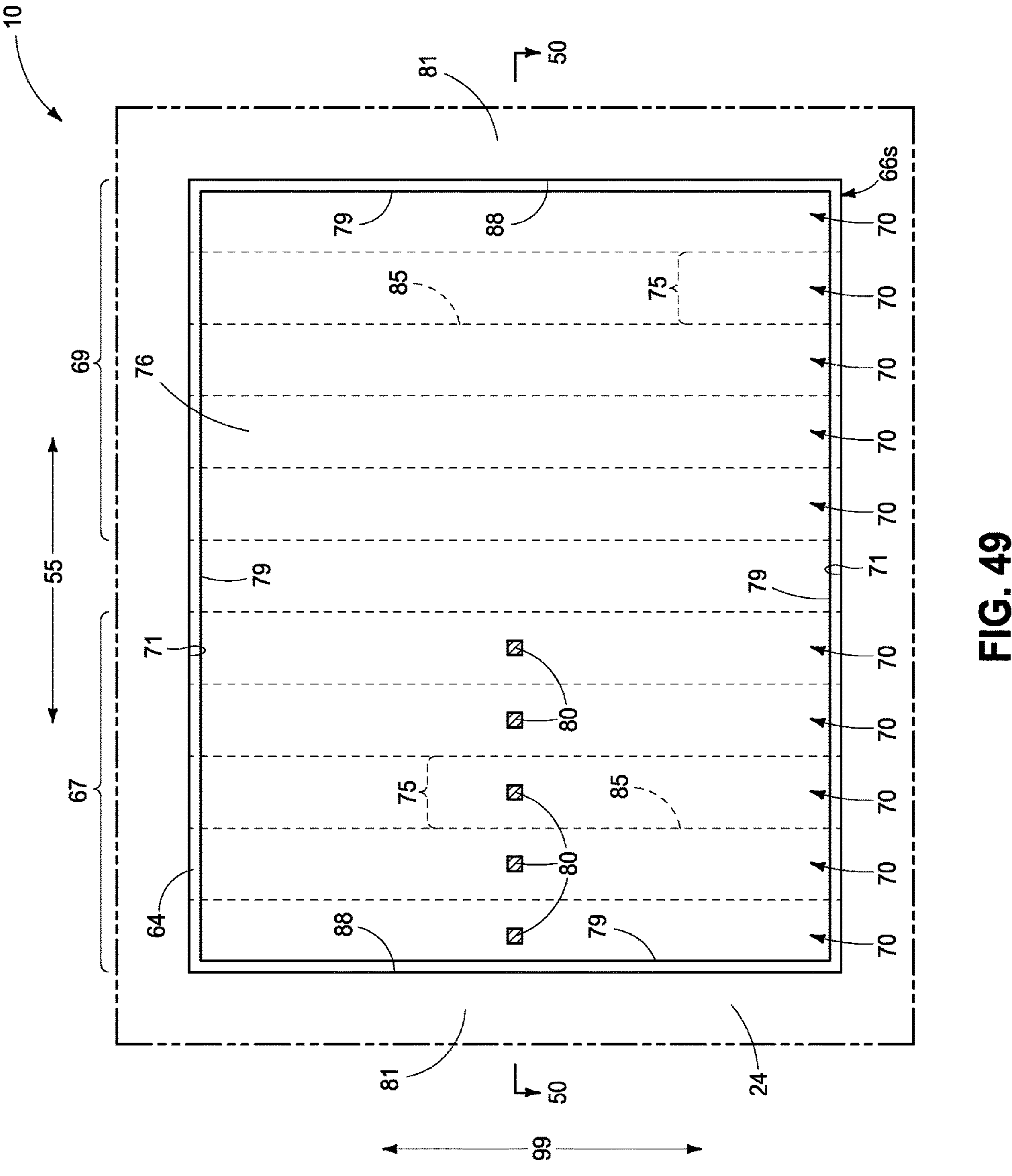
Figure 50:
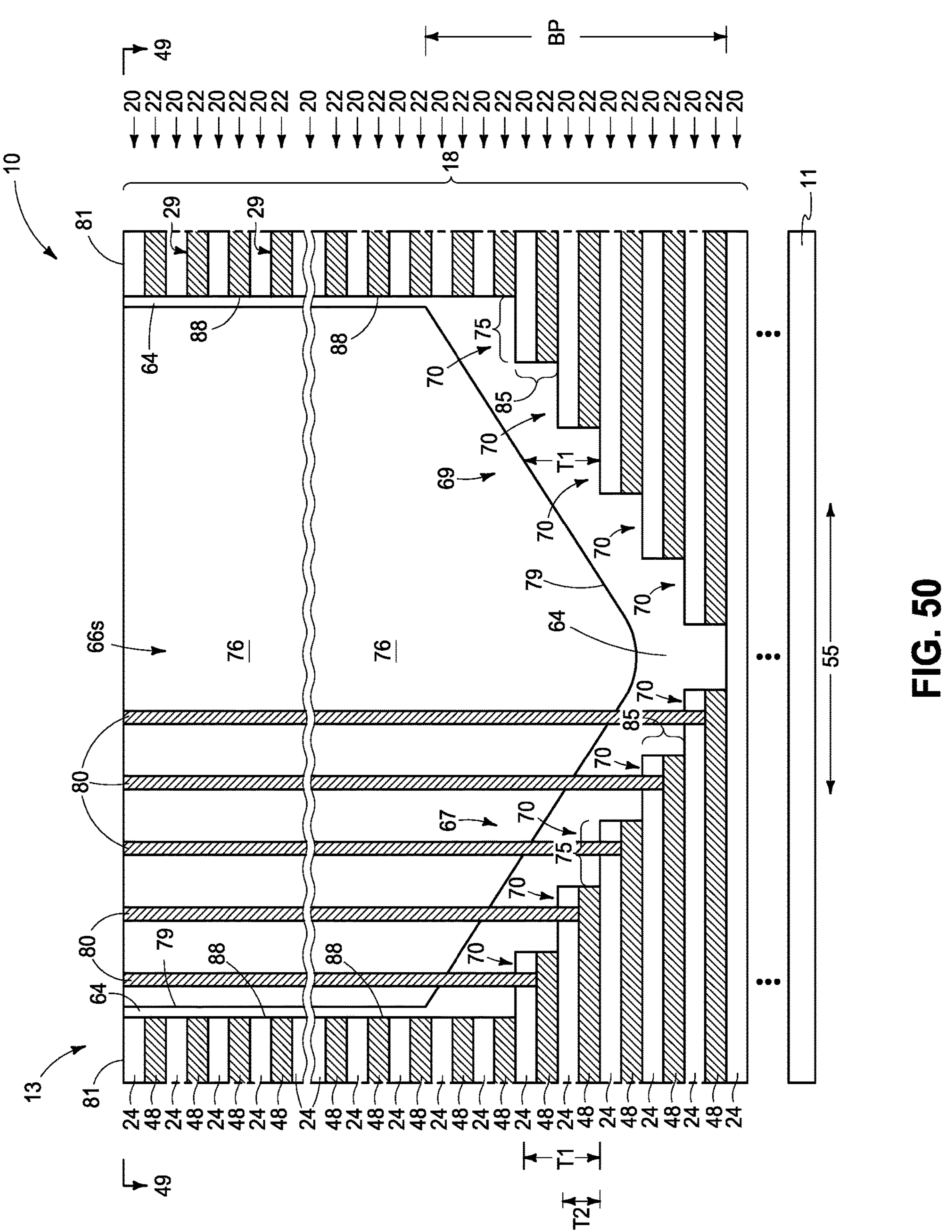
Figure 51:
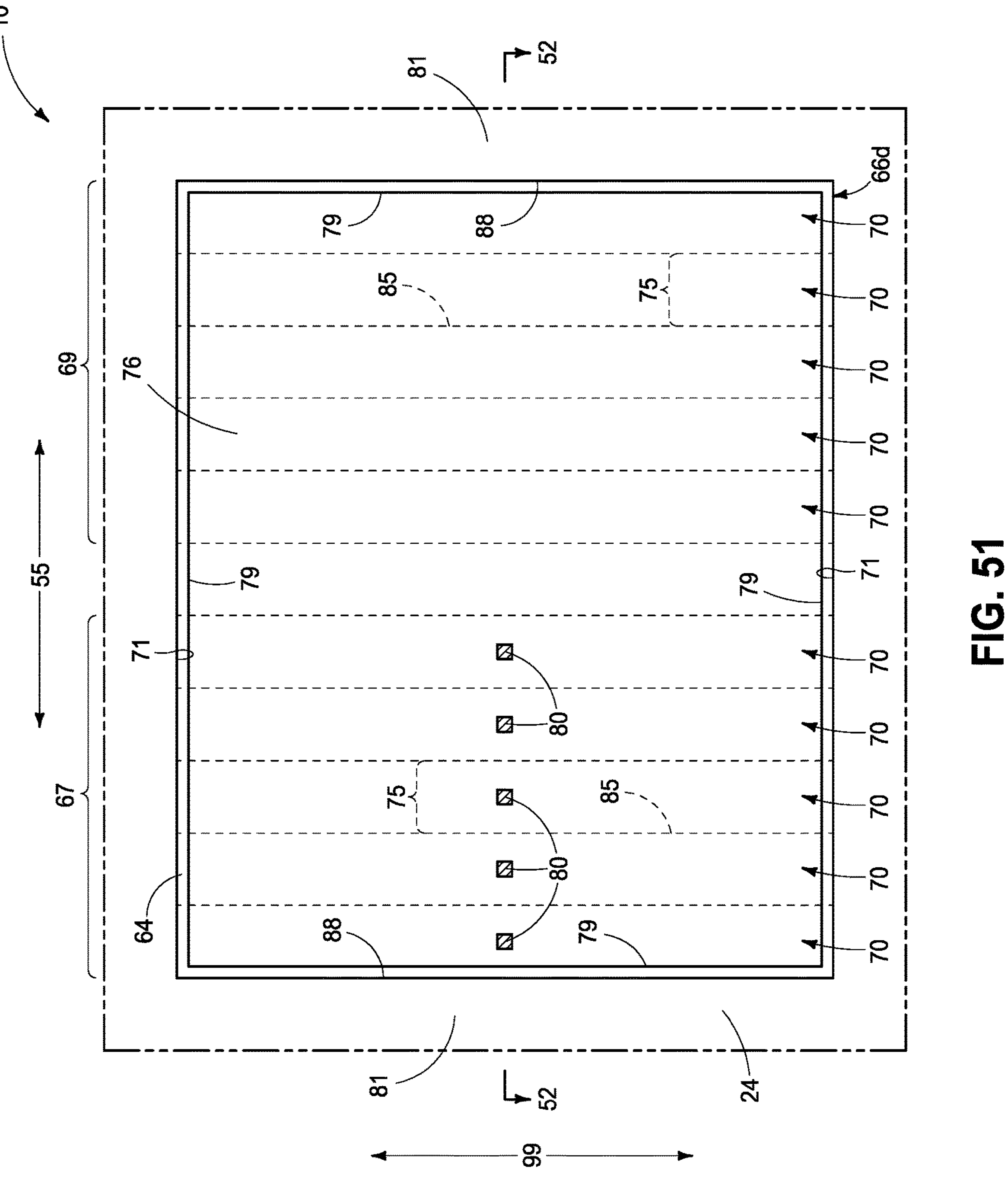
Figure 52:
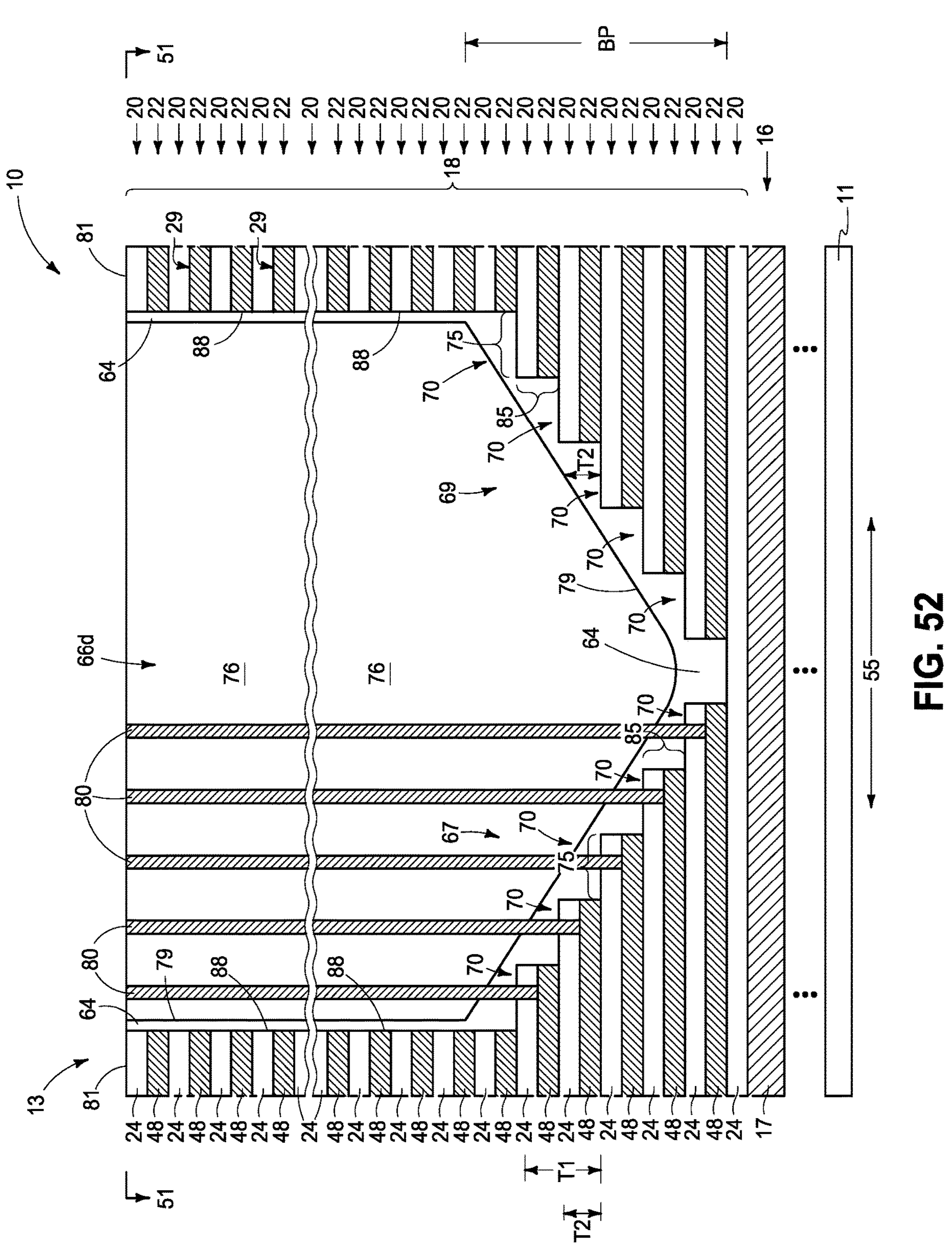
Figure 53:
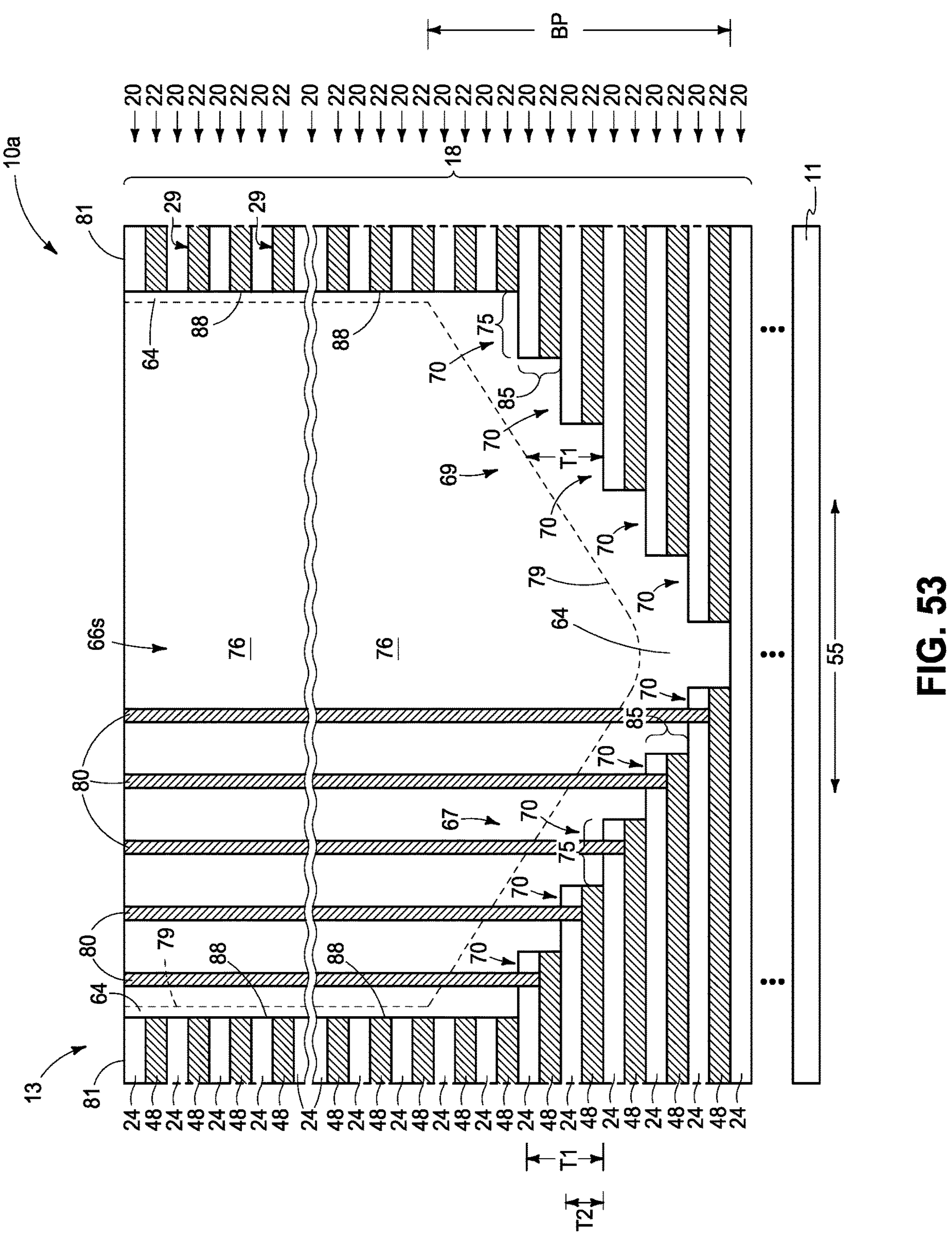
Figure 54:
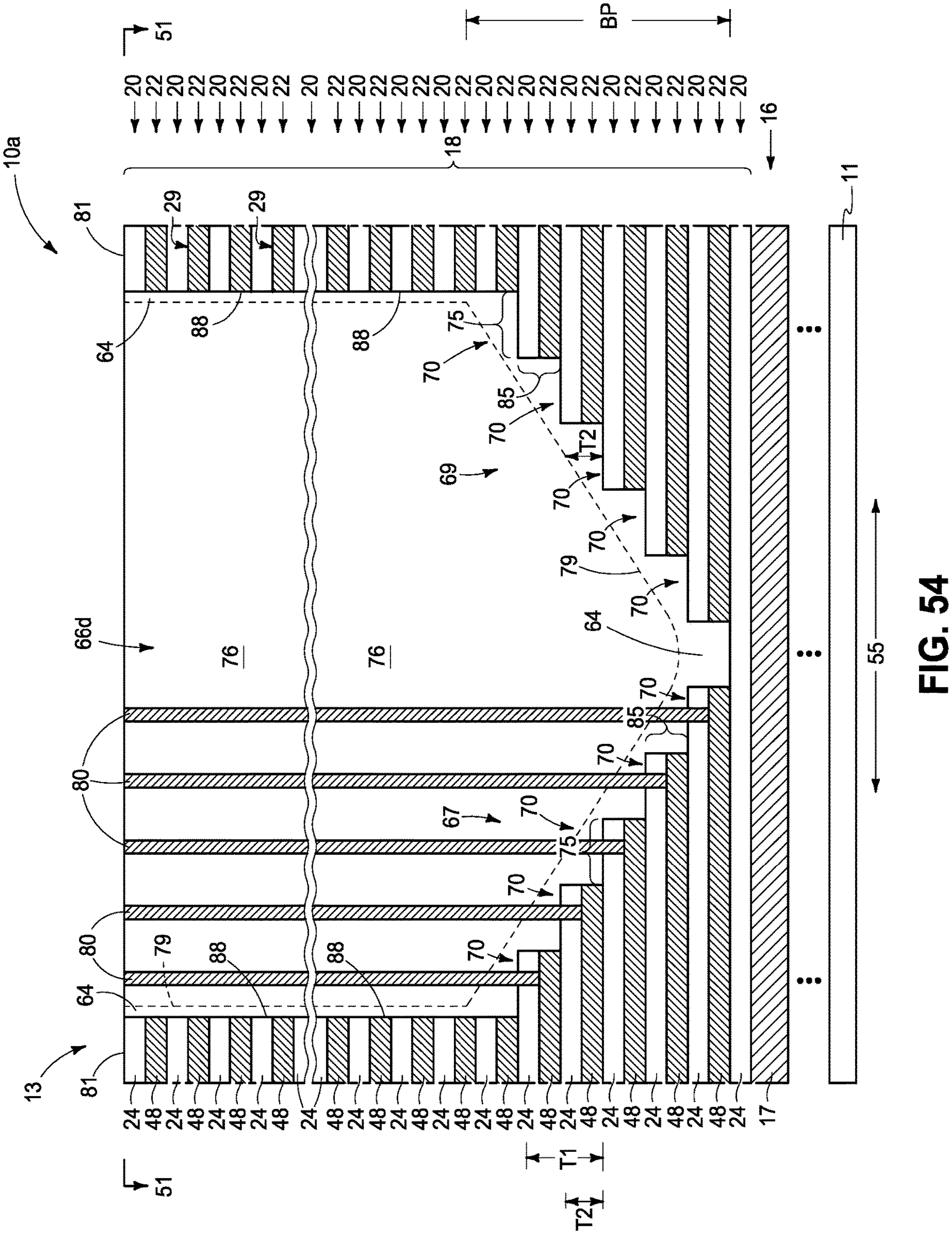
Figure 55:
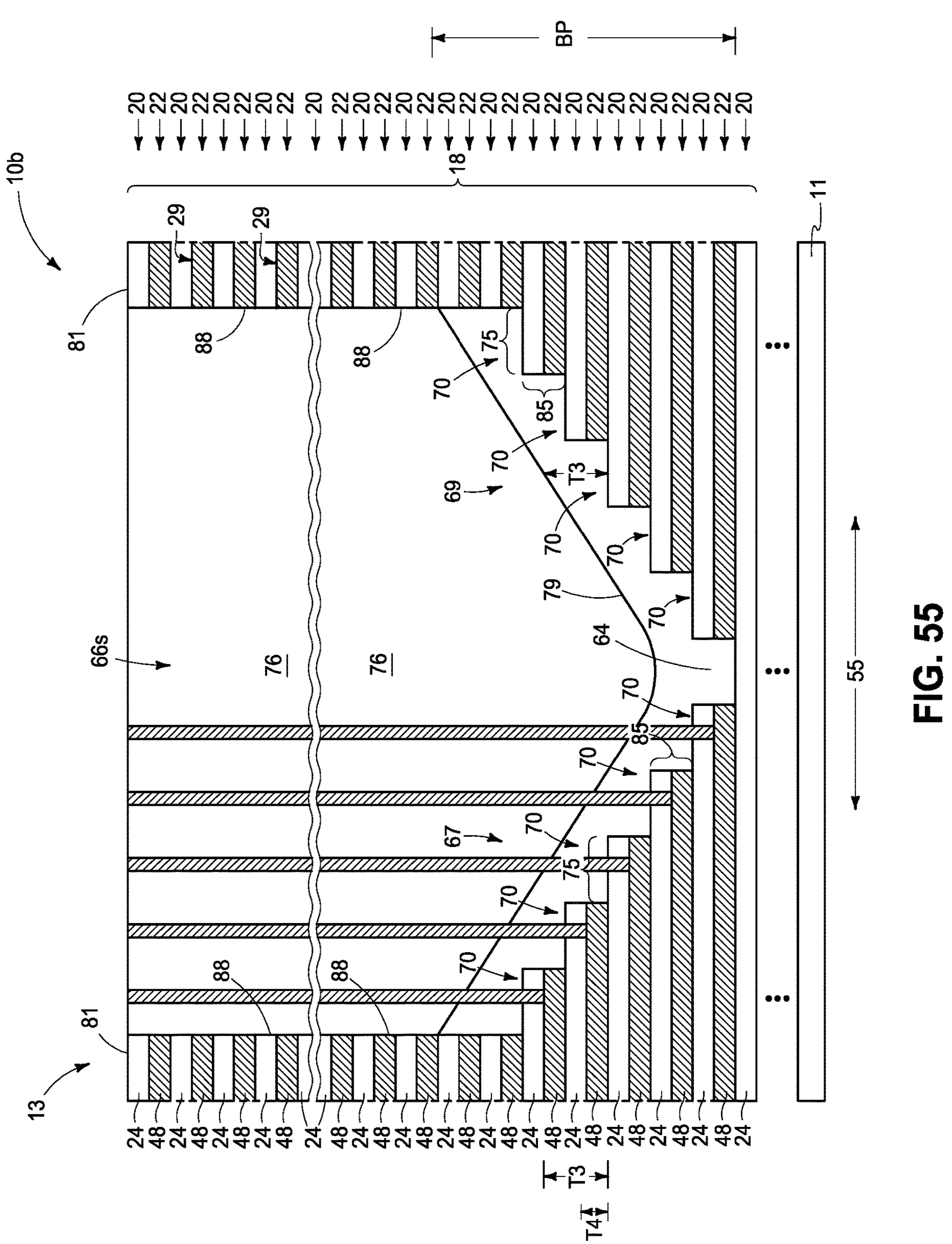

Referring to FIGS. 1 and 6-11, and in one embodiment, cavities 66* have been formed in stack 18 in stair-step region 13 and that individually comprise a stair-step structure as described below (an * being used as a suffix to be inclusive of all such same-numerically-designated structures that may or may not have other suffixes). Example cavities 66* are aligned longitudinally end-to-end in individual memory-block regions 58 and have a crest 81 between immediately-adjacent cavities 66* (e.g., cavities 66* being spaced relative one another in first direction 55 by crests 81). Alternately, only a single cavity may be in individual memory-block regions 58 (not shown). Nevertheless, some method and structure embodiments include fabrication of and a resultant construction having only a single cavity 66*. Cavities 66* are shown as being rectangular in horizontal cross-section, although other shape(s) may be used and all need not be of the same shape relative one another. For brevity, less tiers 20 and 22 are shown in FIGS. 3 and 5 as compared to FIGS. 7, 8, 10 and 11, with more tiers 20 and 22 being shown in FIGS. 7, 8, 10 and 11 for clarity and for better emphasis of example depths of cavities 66* and processing/aspects associated therewith. In one embodiment, one of cavities 66* (at least one) is vertically-shallower in stack 18 (e.g., 66*s* in FIGS. 1 and 9-11) than another of cavities 66* (at least one) that is vertically-deeper in stack 18 (e.g., 66*d* in FIGS. 1 and 6-8). Positions of example cavities 66*s* and 66*d* may be reversed and/or in different positions in FIG. 1 than shown. Of course, cavities 66* may comprise other different stack-depth cavities 66*, for example if each operative flight of stairs is "unique" in spanning a different series of first/conductive tiers 22 (described below). However, and regardless, in an embodiment of the invention having multiple cavities 66* in stair-step region 13, at least one cavity will be shallower than another at least one that is deeper than the at least one shallower cavity.

Example cavities 66* individually comprise a flight 67 or 69 of stairs 70 in a first vertical cross-section (e.g., that of FIG. 7 and that of FIG. 10) along a first direction (e.g., 55). Flights 67 and 69 with a landing there-between may be considered as comprising a stair-step structure. Example flights 67 and 69 oppose one another in cavity 66* and individual stairs 70 comprise a tread 75 and a riser 85. Individual treads 75 will comprise conducting material of one of conductive tiers 22 in the finished-circuitry construction. Cavity 66* with flights 67 and 69 may be formed by any existing or later-developed method(s). As one such example, a masking material (e.g., a photo-imageable material such as photoresist) may be formed atop stack 18 and an opening formed there-through. Then, the masking material may be used as a mask while etching (e.g., anisotropically) through the opening to extend such opening into at least two outermost two tiers 20, 22. The resultant construction may then be subjected to a successive alternating series of lateral-trimming etches of the masking material followed by etching deeper into stack 18, at least two-tiers 20, 22 at a time, using the trimmed masking material having a successively widened opening as a mask. Such an example may result in the forming of flight 67 into stack 18 that comprises vertically alternating tiers 20, 22 of different composition materials 24, 26, and in the forming of another flight 69 opposite and facing flight 67 (e.g., in mirror-image and as shown). Likely more stairs 70 will be in flights 67 and/or 69 than shown. Example stairs 70 in stack 18 are individually shown as comprising one first tier 22 and one second tier 20 (the order of which may be reversed and not shown). More first and second tiers per stair 70 may be used, for example if forming multiple treads per stair (e.g., along second direction 99 and not shown). Further, and regardless, flights 67 and/or 69 may be translated (etched) deeper into stack 18 together and/or while one of flights 67 or 69 is masked depending on the circuitry being fabricated.

In one embodiment, one of two opposing flights 67 and 69 is operative (e.g., flight 67) and the other of two opposing flights 67 and 69 is dummy (e.g., flight 69) in the finished-circuitry construction. In this document, a flight that is "dummy" is circuit-inoperative having stairs thereof in which no current flows in conductive material of the steps and which may be a circuit-inoperable dead end that is not part of a current flow path of a circuit even if extending to or from an electronic component. When inoperative, position of operative vs. inoperative relative to flights 67 and 69 may of course be reversed. Multiple operative flights and multiple dummy flights may be formed in multiple cavities 66*, for example longitudinally end-to-end as shown and to different depths within stack 18. Pairs of opposing mirror-image operative and dummy flights may be considered as defining a stadium (e.g., a vertically recessed portion having opposing flights of stairs as shown). Alternately, only a single flight 67 or 69 may be formed (not shown) in one or more individual cavities 66*. A flight that is operative may vertically span a series of first/conductive tiers 22 that are unique to that flight (i.e., each operative flight spanning a series of first/conductive tiers 22 that is not vertically spanned by any other operative flight). Regardless, cavities 66* may be formed before or after forming channel-material strings 53. Cavities 66* may be considered as having sidewalls 71, 88, and 85 (risers 85 along with sidewalls 88 effectively being part of the sidewalls of cavities 66* that are along second direction 99), with sidewalls 71 being along first direction 55. Sidewalls 71, 88, and/or 85 may taper laterally-inward or laterally-outward moving deeper into stack 18 (not shown).

Referring to FIGS. 12-17, an insulating lining 64 has been formed in vertically-shallower cavity 66*s* and in vertically-deeper cavity 66*d*. Such lining may also of course be formed in other cavities 66*. Insulating lining 64 is atop treads 75 of stairs 70 and laterally-over sidewalls 71 of the respective cavity 66*s*, 66*d* that are along first direction 55 (as a minimum) and ideally laterally-over risers 85 and sidewalls 88 of the respective cavity 66*s*, 66*d*. Insulating lining 64 is thicker in a bottom part BP of the respective cavity 66*s*, 66*d* than over sidewalls 71 of the respective cavity 66*s*, 66*d* that are above the bottom part. Insulating lining 64 may also be thicker atop stack 18 (not shown). Further, in an embodiment having multiple cavities, insulating lining 64 is thicker (T1; average thickness above treads 75 if not conformal) in bottom part BP of vertically-shallower cavity 66_s_ than in bottom part BP of vertically-deeper cavity 66_d_ (T2; average thickness above treads 75 if not conformal). In one embodiment, insulating lining 64 at least predominantly comprises silicon nitride (e.g., at least 50% by volume up to and including 100% silicon nitride; e.g., undoped silicon nitride [e.g., deposited at 550° C. or greater], carbon-doped silicon nitride, boron doped silicon nitride). For example, in an inductively-coupled plasma reactor, example conditions for forming insulating lining 64 to comprise silicon nitride include 200° C. to 600° C., 1 mTorr to 100 mTorr, 3,000 W to 20,000 W total power, and precursors of a silane $N_2$, He, and $H_2$. Further, for example, in a capacitively-coupled plasma reactor, example conditions for forming insulating lining 64 to comprise silicon nitride include 100° C. to 650° C., 1 mTorr to 10 Torr, 100 W to 20,000 W total power, and precursors of a silane and $NH_3$. The artisan is capable of selecting other parameters/conditions for so forming other insulating materials (e.g., $Al_2O_3$ $HfO_x$, $Si_xO_yC_z$, etc.).

Referring to FIGS. 18-23, insulative material 76 has been formed in vertically-shallower cavity 66_s_ and in vertically-deeper cavity 66_d_ directly above insulating lining 64 therein (and of course ideally in other cavities 66* if present). Insulating lining 64 and insulative material 76 may be planarized back at least to the top of stack 18. In one embodiment, insulative material 76 and insulating lining 64 are of the same composition relative one another and yet in another embodiment are of different compositions relative one another. In one latter ideal example, insulating lining 64 at least predominantly comprises silicon nitride and insulative material 76 at least predominantly comprises silicon dioxide (e.g., at least 50% by volume up to and including 100% silicon dioxide; e.g., undoped silicon dioxide, phosphorus and/or boron doped silicon dioxide, spin-on-glass).

FIGS. 18-23 are intended to show an example where insulative material 76 and insulating lining 64 are of different composition relative one another by a solid separating line 79 (an interface 79) between such materials. FIGS. 24-27 are intended to show an example where insulative material 76 and insulating lining 64 are of the same composition relative one another by a dashed-line interface 79 being therebetween in a construction 10_a_. Like numerals from the above-described embodiments have been used where appropriate, with some construction differences being indicated with a suffix "a" or with different numerals. Interface 79 may be continuous or interface 79 may be discontinuous at some place(s) there-along. Interface 79 will be continuous when insulating lining 64 and insulative material 76 are of different compositions relative one another. Interface 79 may or may not be continuous when insulating lining 64 and insulative material 76 are of the same composition relative one another. For example, separate-in-time formed insulating lining 64 and insulative material 76 of the same composition relative one another may nevertheless have a perceptible interface in a finished construction. Some of that interface may effectively disappear (i.e., not be perceptible) and some may remain perceptible whereby that interface is discontinuous in one or more locations longitudinally-there-along (e.g., as may occur by welding of the same-composition materials together due to subsequent heating during manufacture).

FIGS. 18-27 show example embodiments where insulating lining 64 remains (at least some thereof) over sidewalls 71 (and ideally sidewalls 88) above bottom part BP prior to forming insulative material 76 and will also remain in the respective finished circuitry construction. FIGS. 28-33 show an example alternate embodiment construction 10_b_ (corresponding more to construction 10 than construction 10_a_) where all remaining of insulating lining 64 that was above bottom part BP has been removed from being over sidewalls 71 (and ideally sidewalls 88) above bottom part BP. Like numerals from the above-described embodiments have been used where appropriate, with some construction differences being indicated with a suffix "b" or with different numerals. In one such embodiment and as shown, such act of removing (e.g., by isotropic wet etching) also removes some and only some of insulating lining 64 that is in bottom part BP thereby reducing its thickness in bottom part BP (e.g., T1 to T3 and T2 to T4). Such processing and an analogous resultant construction may also occur with respect to construction 10_a_ (not shown).

Referring to FIGS. 34-38, horizontally-elongated trenches 40 have been formed into stack 18 (e.g., by anisotropic etching) and which are individually between immediately-laterally-adjacent memory-block regions 58. Trenches 40 will typically be wider than channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Trenches 40 may taper laterally-inward and/or outward in vertical cross-section (not shown). Conductive vias to stairs 70 (described below and not-yet-shown) and through-array-vias (TAVs, and not shown) in stair-step region 13 may be formed before or after forming trenches 40. Sidewalls 71 of cavities 66* may be laterally-spaced inwardly from immediately-laterally-adjacent trenches 40 or may not be so spaced, for example depending on whether operative stair flight 67 is directly electrically coupled to only one or to both of two memory-array regions 12.

Referring to FIGS. 39-48, material 26 (not shown) of first tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines in stack 18) and elevationally-extending strings 49 of individual transistors and/or memory cells 56 in stack 18.

A thin insulative liner (e.g., $Al_2O_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through-array vias (not shown).

Referring to FIGS. 49-52, conductive vias 80 have been formed through insulative material 76 and insulating lining 64 in vertically-shallower cavity **66*s* and in vertically-deeper cavity 66*d* (and of course likely in other cavities 66* if present), with individual conductive vias 80 being directly above and directly against conducting material 48 of tread 75 of individual stairs 70. An insulative lining (e.g., silicon nitride and not shown) may be circumferentially around individual conductive vias 80**.

FIGS. 53-56 show example finished-construction embodiments **10*a* and 10*b***.

In one embodiment, a method used in forming memory circuitry (e.g., 10, **10*a*, 10*b*) comprises forming a stack (e.g., 18) comprising vertically-alternating first tiers (e.g., 22) and second tiers (e.g., 20). The stack extends from a memory-array region (e.g., 12) into a stair-step region (e.g., 13). The stack in the stair-step region comprises a cavity (e.g., 66*) comprising a flight (e.g., 67 or 69) of stairs (e.g., 70) in a vertical cross-section (e.g., FIG. 7 or FIG. 10) along a first direction (e.g., 55). The first tiers are conductive and the second tiers are insulative in a finished-circuitry construction. An insulating lining (e.g., 64) is formed in the cavity atop treads (e.g., 75) of the stairs and laterally-over sidewalls (e.g., 71) of the cavity that are along the first direction. Individual of the treads comprise conducting material (e.g., 48) of one of the conductive tiers in the finished-circuitry construction. The insulating lining is thicker (e.g., T1 or T2 or T3 or T4) in a bottom part (e.g., BP) of the cavity than over the sidewalls of the cavity that are above the bottom part. Insulative material (e.g., 76) is formed in the cavity directly above the insulating lining. Conductive vias (e.g., 80**) are formed through the insulative material and the insulating lining. Individual of the conductive vias are directly above and directly against the conducting material of the tread of individual of the stairs. Any other attribute(s) or aspect(s) as shown and/or described herein with respect to other embodiments may be used.

Any other attribute(s) or aspect(s) as shown and/or described herein with respect to other embodiments may be used in the embodiments shown and described with reference to the above embodiments.

A motivation of the invention relates to overcoming a problem associated with the formation of TAVs (not shown) though material that is within and below cavities 66*. Although for convenience and simplicity sidewalls 71 are shown as being perfectly vertical, in practice such are typically tapered laterally-inward such that individual cavities 66* are narrower along direction 99 moving deeper into the stack, thereby increasing likelihood of some TAVs having to go through the typical silicon-nitride lining that is part of insulating material 64, 76. A purpose for such lining is to provide an etch-stopping function when etching via openings to each tread 75 for vias 80 because such via openings must go to different depths in stack 18 to stop on the different depth treads 75. However, where sidewalls 71 are tapered as described, this etch-stopping function can adversely impact the etch of the via openings for the TAVs going there-through, causing such to bend in the direction of an immediately-adjacent such via opening, leading to shorting and failed circuitry. Processing as shown and described herein may alleviate such issues.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, memory circuitry (e.g., 10, **10*a*, 10*b*) comprising strings (e.g., 49) of memory cells (e.g., 56) comprises a stack (e.g., 18) comprising vertically-alternating insulative tiers (e.g., 20) and conductive tiers (e.g., 22). Channel-material strings (e.g., 53) of memory cells extend through the insulative tiers and the conductive tiers in a memory-array region (e.g., 12). The insulative tiers and the conductive tiers extend from the memory-array region into a stair-step region (e.g., 13). The stack in the stair-step region comprises a cavity (e.g., 66*) comprising a flight (e.g., 67 or 69) of stairs (e.g., 70) in a first vertical cross-section (e.g., FIG. 50, 52, 53, 54, 55, 56) along a first direction (e.g., 55). Insulating material (e.g., 64, 76) in the cavity is directly above the flight of stairs. The insulating material comprises first insulative material (e.g., 64) atop treads (e.g., 75) of the stairs of the flight of stairs and laterally-over sidewalls (e.g., 71) of the cavity that are along the first direction. Individual of the treads comprise conducting material (e.g., 48) of one of the conductive tiers. The first insulative material is thicker (e.g., T1 or T2 or T3 or T4) in a bottom part (e.g., BP) of the cavity than over the sidewalls of the cavity that are above the bottom part. A second insulative material (e.g., 76) is directly above the first insulative material. An interface (e.g., 79) is between the first and second insulative materials. The interface is along a top of the first insulative material. Conductive vias (e.g., 80**) extend through the second insulative material, the interface, and the first insulating material. Individual of the conductive vias are directly above and directly against the conducting material of the tread of individual of the stairs. Any other attribute(s) or aspect(s) as shown and/or described herein with respect to other embodiments may be used.

In one embodiment, memory circuitry (e.g., 10, 10*a*, 10*b*) comprising strings (e.g., 49) of memory cells (e.g., 56) comprises a stack (e.g., 18) comprising vertically-alternating insulative tiers (e.g., 20) and conductive tiers (e.g., 22). Channel-material strings (e.g., 53) of memory cells extend through the insulative tiers and the conductive tiers in a memory-array region (e.g., 12). The insulative tiers and the conductive tiers extend from the memory-array region into a stair-step region (e.g., 13) along a first direction (e.g., 55). Cavities (e.g., 66*) are in the stack in the stair-step region and individually comprise a flight of stairs (e.g., 67 or 69) in a vertical cross-section (e.g., FIG. 50, 52, 53, 54, 55, 56) along the first direction. The cavities are spaced relative one another in the first direction. One of the cavities (e.g., 66*s*) is vertically-shallower in the stack than another of the cavities (e.g., 66*d*) that is vertically-deeper in the stack. Insulating material (e.g., 64, 76) is in the vertically-shallower cavity and in the vertically-deeper cavity atop treads (e.g., 75) of the stairs of the flight of stairs. The insulating material comprises first insulative material (e.g., 64) atop the treads of the stairs. Individual of the treads comprise conducting material (e.g., 48) of one of the conductive tiers. The first insulative material where in the vertically-shallower cavity is thickest in a bottom part (e.g., BP) of the vertically-shallower cavity. The first insulative material where in the vertically-deeper cavity is thickest in a bottom part (e.g., BP) of the vertically-deeper cavity. The first insulative material is thicker in the bottom part of the vertically-shallower cavity than in the bottom part of the vertically-deeper cavity. A second insulative material (e.g., 76) is directly above the first insulative material. An interface (e.g., 79) is between the first and second insulative materials. The interface is along a top of the first insulative material. Conductive vias (e.g., 80) extend through the second insulative material, the interface, and the first insulating material in the vertically-shallower cavity and in the vertically-deeper cavity. Individual of the conductive vias are directly above and directly against the conducting material of the tread of individual of the stairs.

In one embodiment, the first insulative material is laterally-over sidewalls of the respective cavity that are along the first direction above the respective bottom part. In another embodiment, the first insulative material is not laterally-over sidewalls of the respective cavity that are along the first direction above the respective bottom part.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming memory circuitry comprises forming a stack comprising vertically-alternating first tiers and second tiers. The stack extends from a memory-array region into a stair-step region. The stack in the stair-step region comprises a cavity comprising a flight of stairs in a vertical cross-section along a first direction. The first tiers are conductive and the second tiers are insulative in a finished-circuitry construction. An insulating lining is formed in the cavity atop treads of the stairs and laterally-over sidewalls of the cavity that are along the first direction. Individual of the treads comprise conducting material of one of the conductive tiers in the finished-circuitry construction. The insulating lining is thicker in a bottom part of the cavity than over the sidewalls of the cavity that are above the bottom part. Insulative material is formed in the cavity directly above the insulating lining. Conductive vias are formed through the insulative material and the insulating lining. Individual of the conductive vias are directly above and directly against the conducting material of the tread of individual of the stairs.

In some embodiments, a method used in forming memory circuitry comprises forming a stack comprising vertically-alternating first tiers and second tiers. The stack extends from a memory-array region into a stair-step region along a first direction. The first tiers are conductive and the second tiers are insulative in a finished-circuitry construction. Cavities in the stack are formed in the stair-step region that individually comprise a flight of stairs in a vertical cross-section along the first direction. The cavities are spaced relative one another in the first direction. One of the cavities is vertically-shallower in the stack than another of the cavities that is vertically-deeper in the stack. An insulating lining is formed in the vertically-shallower cavity and in the vertically-deeper cavity atop treads of the stairs and laterally-over sidewalls of the respective cavity that are along the first direction. Individual of the treads comprise conducting material of one of the conductive tiers in the finished-circuitry construction. The insulating lining is thicker in a bottom part of the respective cavity than over the sidewalls of the respective cavity that are above the respective bottom part. The insulating lining is thicker in the bottom part of the vertically-shallower cavity than in the bottom part of the vertically-deeper cavity. Insulative material is formed in the vertically-shallower cavity and in the vertically-deeper cavity directly above the insulating lining therein. Conductive vias are formed through the insulative material and the insulating lining in the vertically-shallower cavity and in the vertically-deeper cavity. Individual of the conductive vias are directly above and directly against the conducting material of the tread of individual of the stairs.

In some embodiments, memory circuitry comprising strings of memory cells comprises a stack comprising vertically-alternating insulative tiers and conductive tiers. Channel-material strings of memory cells extend through the insulative tiers and the conductive tiers in a memory-array region. The insulative tiers and the conductive tiers extend from the memory-array region into a stair-step region. The stack in the stair-step region comprises a cavity comprising a flight of stairs in a first vertical cross-section along a first direction. Insulating material is in the cavity directly above the flight of stairs. The insulating material comprises first insulative material atop treads of the stairs of the flight of stairs and laterally-over sidewalls of the cavity that are along the first direction. Individual of the treads comprise conducting material of one of the conductive tiers. The first insulative material is thicker in a bottom part of the cavity than over the sidewalls of the cavity that are above the bottom part. Second insulative material is directly above the first insulative material. An interface is between the first and second insulative materials. The interface is along a top of the first insulative material. Conductive vias extend through the second insulative material, the interface, and the first insulating material. Individual of the conductive vias are directly above and directly against the conducting material of the tread of individual of the stairs.

In some embodiments, memory circuitry comprising strings of memory cells comprises a stack comprising vertically-alternating insulative tiers and conductive tiers. Channel-material strings of memory cells extend through the insulative tiers and the conductive tiers in a memory-array region. The insulative and conductive tiers extend from the memory-array region into a stair-step region along a first direction. Cavities are in the stack in the stair-step region that individually comprise a flight of stairs in a vertical cross-section along the first direction. The cavities are spaced relative one another in the first direction. One of the cavities is vertically-shallower in the stack than another of the cavities that is vertically-deeper in the stack. Insulating material is in the vertically-shallower cavity and in the vertically-deeper cavity atop treads of the stairs of the flight of stairs. The insulating material comprises first insulative material atop the treads of the stairs. Individual of the treads comprise conducting material of one of the conductive tiers. The first insulative material where in the vertically-shallower cavity is thickest in a bottom part of the vertically-shallower cavity. The first insulative material where in the vertically-deeper cavity is thickest in a bottom part of the vertically-deeper cavity. The first insulative material is thicker in the bottom part of the vertically-shallower cavity than in the bottom part of the vertically-deeper cavity. Second insulative material is directly above the first insulative material. An interface is between the first and second insulative materials. The interface is along a top of the first insulative material. Conductive vias extend through the second insulative material, the interface, and the first insulating material in the vertically-shallower cavity and in the vertically-deeper cavity. Individual of the conductive vias are directly above and directly against the conducting material of the tread of individual of the stairs.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming memory circuitry, comprising:

forming a stack comprising vertically-alternating first tiers and second tiers, the stack extending from a memory-array region into a stair-step region along a first direction, the first tiers being conductive and the second tiers being insulative in a finished-circuitry construction;

forming cavities in the stack in the stair-step region that individually comprise a flight of stairs in a vertical cross-section along the first direction, the cavities being spaced relative one another in the first direction, one of the cavities being vertically-shallower in the stack than another of the cavities that is vertically-deeper in the stack;

forming an insulating lining in the vertically-shallower cavity and in the vertically-deeper cavity atop treads of the stairs and laterally-over sidewalls of the respective cavity that are along the first direction, individual of the treads comprising conducting material of one of the conductive tiers in the finished-circuitry construction, the insulating lining being thicker in a bottom part of the respective cavity than over the sidewalls of the respective cavity that are above the respective bottom part, the insulating lining being thicker in the bottom part of the vertically-shallower cavity than in the bottom part of the vertically-deeper cavity;

forming insulative material in the vertically-shallower cavity and in the vertically-deeper cavity directly above the insulating lining therein; and forming conductive vias through the insulative material and the insulating lining in the vertically-shallower cavity and in the vertically-deeper cavity, individual of the conductive vias being directly above and directly against the conducting material of the tread of individual of the stairs.

2. The method of claim 1 wherein the insulating lining at least predominantly comprises silicon nitride.

3. The method of claim 1 wherein the insulative material and the insulating lining are of different compositions relative one another.

4. The method of claim 3 wherein the insulating lining at least predominantly comprises silicon nitride and the insulative material at least predominantly comprises silicon dioxide.

5. The method of claim 1 wherein the insulative material and the insulating lining are of the same composition relative one another.

6. The method of claim 1 comprising removing all of the insulating lining from being over the sidewalls of the respective cavity that are above the respective bottom part.

7. The method of claim 6 wherein the removing removes some and only some of the insulating lining that is in the bottom part thereby reducing its thickness in the bottom part.

8. The method of claim 1 wherein the insulating lining remains over the respective sidewalls above the respective bottom part in the finished circuitry construction.

* * * * *